United States Patent
Abe et al.

(10) Patent No.: US 8,525,140 B2
(45) Date of Patent: Sep. 3, 2013

(54) CHAMBER APPARATUS, EXTREME ULTRAVIOLET LIGHT GENERATION SYSTEM, AND METHOD FOR CONTROLLING THE EXTREME ULTRAVIOLET LIGHT GENERATION SYSTEM

(75) Inventors: Tooru Abe, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/494,466

(22) Filed: Jun. 12, 2012

(65) Prior Publication Data

US 2013/0026393 A1   Jan. 31, 2013

(30) Foreign Application Priority Data

Jul. 27, 2011 (JP) .................................. 2011-164290

(51) Int. Cl.
  *G21K 5/00* (2006.01)
  *G21K 5/10* (2006.01)
  *H05G 2/00* (2006.01)
  *G03F 7/20* (2006.01)

(52) U.S. Cl.
  CPC ............ *H05G 2/003* (2013.01); *G03F 7/70033* (2013.01); *H05G 2/008* (2013.01)
  USPC ................. 250/504 R; 250/492.1; 250/493.1; 315/111.21; 355/67

(58) Field of Classification Search
  CPC ..... H05G 2/003; H05G 2/008; G03F 7/70033
  USPC .......... 250/504 R, 492.1, 493.1; 315/111.21; 355/67
  See application file for complete search history.

(56) References Cited

U.S. PATENT DOCUMENTS

| | | | | |
|---|---|---|---|---|
| 8,242,472 | B2 * | 8/2012 | Moriya et al. | 250/504 R |
| 8,399,870 | B2 * | 3/2013 | Moriya et al. | 250/504 R |
| 2007/0008517 | A1 * | 1/2007 | Fomenkov et al. | 356/218 |
| 2010/0110405 | A1 * | 5/2010 | Loopstra et al. | 355/67 |
| 2010/0117009 | A1 * | 5/2010 | Moriya et al. | 250/504 R |
| 2010/0140512 | A1 * | 6/2010 | Suganuma et al. | 250/504 R |
| 2010/0181503 | A1 * | 7/2010 | Yanagida et al. | 250/504 R |
| 2010/0258750 | A1 * | 10/2010 | Partlo et al. | 250/504 R |
| 2010/0294958 | A1 * | 11/2010 | Hayashi et al. | 250/504 R |
| 2011/0309260 | A1 * | 12/2011 | Nishisaka et al. | 250/372 |
| 2011/0309271 | A1 * | 12/2011 | Moriya et al. | 250/504 R |
| 2012/0019826 | A1 * | 1/2012 | Graham et al. | 356/400 |
| 2012/0319014 | A1 * | 12/2012 | Moriya et al. | 250/504 R |
| 2013/0026393 | A1 * | 1/2013 | Abe et al. | 250/504 R |
| 2013/0037693 | A1 * | 2/2013 | Moriya et al. | 250/201.2 |
| 2013/0062539 | A1 * | 3/2013 | Hayashi et al. | 250/504 R |

* cited by examiner

*Primary Examiner* — David A Vanore
(74) *Attorney, Agent, or Firm* — McDermott Will & Emery LLP

(57) ABSTRACT

A chamber apparatus for operating with a laser apparatus includes a chamber, a target supply unit, a first optical system and a second optical system. The chamber has an inlet for introducing a laser beam thereinto. The target supply unit supplies a target material to a region inside the chamber. The first optical system focuses the laser beam in the region. The guide beam output device outputs a guide beam. The second optical system directs the guide beam such that an axis of a beam path of the guide beam substantially coincides with an axis of a beam path of the laser beam and such that the guide beam enters the focusing optical system through the region.

13 Claims, 18 Drawing Sheets

US 8,525,140 B2

CHAMBER APPARATUS, EXTREME ULTRAVIOLET LIGHT GENERATION SYSTEM, AND METHOD FOR CONTROLLING THE EXTREME ULTRAVIOLET LIGHT GENERATION SYSTEM

CROSS-REFERENCE TO RELATED APPLICATION

The present application claims priority from Japanese Patent Application No. 2011-164290 filed Jul. 27, 2011.

BACKGROUND

1. Technical Field

This disclosure relates to a chamber apparatus, an extreme ultraviolet (EUV) light generation system, and a method for controlling the extreme ultraviolet light generation system.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

A chamber apparatus according to one aspect of this disclosure, which may operate with a laser apparatus, may include: a chamber having an inlet for introducing a laser beam thereinto; a target supply unit configured to supply a target material to a region inside the chamber; a first optical system for focusing the laser beam in the region; a guide beam output device configured to output a guide beam; and a second optical system configured to direct the guide beam such that an axis of a beam path of the guide beam substantially coincides with an axis of a beam path of the laser beam and such that the guide beam enters the first optical system through the region.

An apparatus for generating extreme ultraviolet light according to another aspect of this disclosure may include: the above-described chamber apparatus; and a laser apparatus configured to output a laser beam.

A method according to yet another aspect of this disclosure for controlling an apparatus configured to generate extreme ultraviolet light, which may include a laser apparatus, a chamber, a target supply unit, a focusing optical system, a guide beam output device, an optical system, a detection unit, a first driving mechanism, and a controller, may include controlling the first driving mechanism such that an image of a guide beam detected by the detection unit lies in a desired position.

BRIEF DESCRIPTION OF THE DRAWINGS

Hereinafter, selected embodiments of this disclosure will be described with reference to the accompanying drawings.

DETAILED DESCRIPTION

Figure 1:
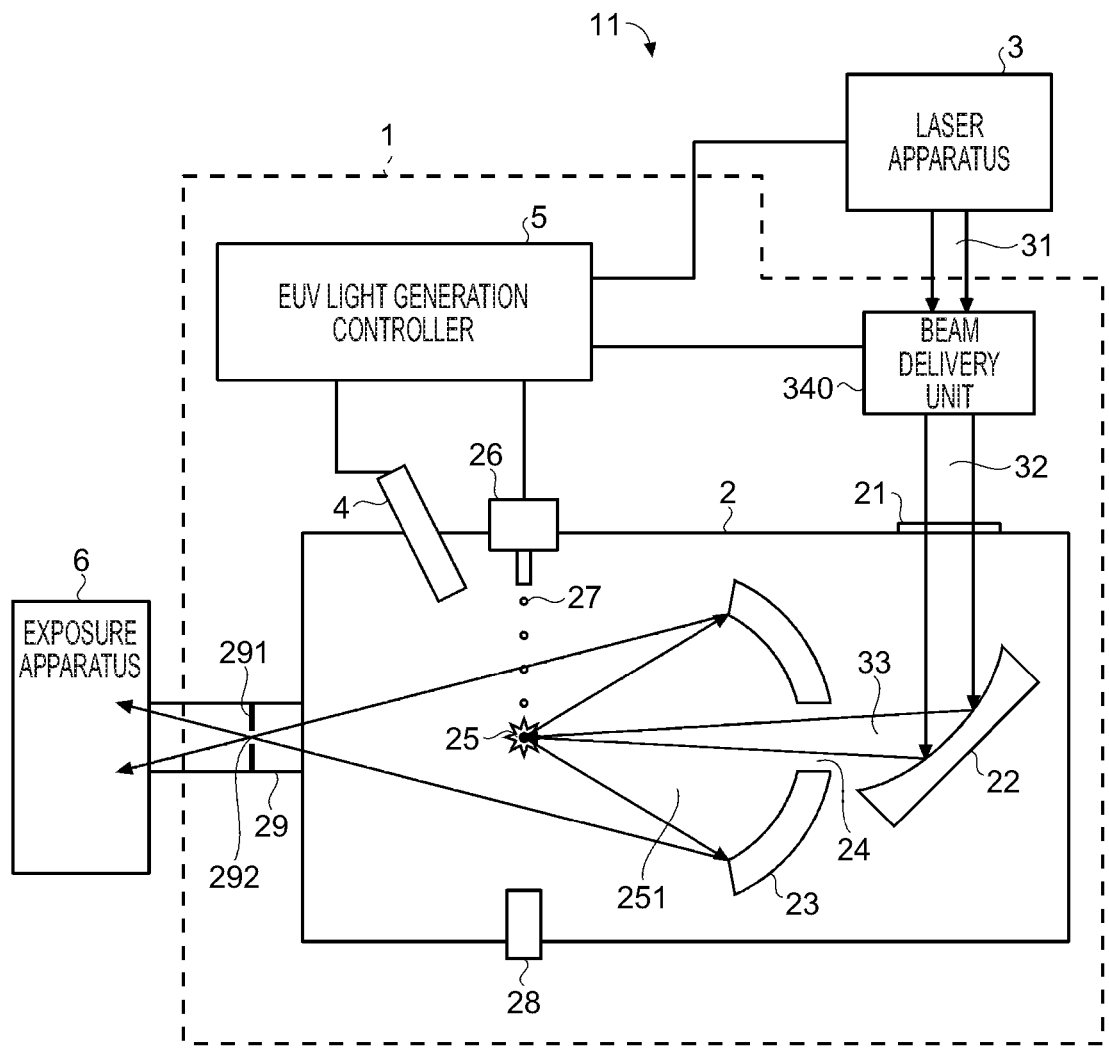
FIG. 1 schematically illustrates the configuration of an exemplary LPP type EUV light generation system.

Hereinafter, selected embodiments of this disclosure will be described in detail with reference to the accompanying drawings. The embodiments to be described below are merely illustrative in nature and do not limit the scope of this disclosure. Further, the configuration(s) and operation(s) described in each embodiment are not all essential in implementing this disclosure. Note that like elements are referenced by like reference numerals and characters, and duplicate descriptions thereof will be omitted herein. The embodiments of this disclosure will be illustrated following the table of contents below.

Contents
1. Overview
2. Terms
3. Overview of EUV Light Generation System
3.1 Configuration
3.2 Operation
4. EUV Light Generation System Including Detector for Detecting Positions of Guide Beam, Irradiation Target, and Plasma-Emitted Light: First Embodiment
4.1 Configuration
4.2 Operation
4.3 Effect
4.4 Flowchart
5. Specific Examples of Mirror Unit
5.1 First Example
5.1.1 Configuration
5.1.2 Operation
5.1.3 Effect
5.2 Second Example
5.2.1 Configuration
5.2.2 Operation
5.2.3 Effect
5.3 Third Example
5.3.1 Configuration
5.3.2 Operation
5.3.3 Effect
6. Modification of Guide Beam Optical System
6.1 Configuration
6.2 Operation
6.3 Effect
7. EUV Light Generation System Including Pre-pulse Laser apparatus and Main Pulse Laser Apparatus: Second Embodiment
7.1 Configuration
7.2 Operation
7.3 Effect
7.4 Flowchart
1. Overview Embodiments to be described hereinafter relate to an LPP type EUV light generation system that includes a detector for detecting the position of a guide beam and the position of a target.

2. Terms

Terms used in this disclosure may be interpreted as follows. The term "droplet" may refer to one or more liquid droplet(s) of a molten target material. Accordingly, the shape thereof may be substantially spherical due to its surface tension. The term "plasma generation region" may refer to a three-dimensional space in which plasma is to be generated. In a beam path of a laser beam, a direction toward the laser apparatus or a side closer to the laser apparatus is referred to as "upstream," and a direction or a side toward which the laser beam travels from the laser apparatus is referred to as "downstream."

3. Overview of EUV Light Generation System
3.1 Configuration

FIG. 1 schematically illustrates the configuration of an exemplary LPP type EUV light generation system. An LPP type EUV light generation apparatus 1 may be used with at least one laser apparatus 3. Hereinafter, a system that includes the EUV light generation apparatus 1 and the laser apparatus 3 may be referred to as an EUV light generation system 11. As illustrated in FIG. 1 and described in detail below, the EUV light generation system 11 may include a chamber 2 and a target supply unit, and so forth. The target supply unit may be a droplet generator 26. The chamber 2 may be airtightly sealed. The target supply unit may be mounted onto the chamber 2 so as to, for example, penetrate a wall of the chamber 2. A target material to be supplied by the target supply unit may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may be provided with a window 21, through which the pulse laser beam 32 may travel into the chamber 2. An EUV collector mirror 23 having a spheroidal surface may be provided inside the chamber 2, for example. The EUV collector mirror 23 may have a multi-layered reflective film formed on the spheroidal surface thereof. The reflective film may include a molybdenum layer and a silicon layer, which are laminated alternately. The EUV collector mirror 23 may have a first focus and a second focus, and preferably be positioned such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, the trajectory, and the position of a droplet 27.

Further, the EUV light generation system 11 may include a connection part 29 for allowing the interior of the chamber 2 and the interior of the exposure apparatus 6 to be in communication with each other. A wall 291 having an aperture may be provided inside the connection part 29, and the wall 291 may be positioned such that the second focus of the EUV collector mirror 23 lies in the aperture formed in the wall 291.

The EUV light generation system 11 may also include a beam delivery unit 340, a laser beam focusing optical system 22, and a target collector 28 for collecting droplets 27. The beam delivery unit 340 may include an optical element for defining the direction into which the pulse laser beam 32 travels and include an actuator for adjusting the position and the orientation (posture) of the optical element.

3.2 Operation

With continued reference to FIG. 1, a pulse laser beam 31 outputted from the laser apparatus 3 may pass through the beam delivery unit 340 and be outputted therefrom as a pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing optical system 22, and strike at least one droplet 27 as a pulse laser beam 33.

The target supply unit may be configured to output the droplet(s) 27 toward the plasma generation region 25 inside the chamber 2. The droplet 27 may be irradiated with at least one pulse of the pulse laser beam 33. Upon being irradiated with the pulse laser beam 33, the droplet 27 may be turned into plasma, and rays of light 251 including EUV light may be emitted from the plasma. At least the EUV light included in the light 251 may be reflected selectively by the EUV collector mirror 23. The EUV light reflected by the EUV collector mirror 23 may travel through the intermediate focus region 292 and be outputted to the exposure apparatus 6. Here, the droplet 27 may be irradiated with multiple pulses included in the pulse laser beam 33.

The EUV light generation controller 5 may be configured to integrally control the EUV light generation system 11. The EUV light generation controller 5 may be configured to process image data of the droplet 27 captured by the target sensor 4. Further, the EUV light generation controller 5 may be configured to control at least one of the timing at which the droplet 27 is outputted and the direction into which the droplet 27 is outputted. Furthermore, the EUV light generation controller 5 may be configured to control at least one of the timing at which the laser apparatus 3 oscillates, the direction in which the pulse laser beam 31 travels, and the position at which the pulse laser beam 33 is focused. It will be understood that the various controls mentioned above are merely examples, and other controls may be added as necessary.

4. EUV Light Generation System Including Detector for Detecting Positions of Guide Beam, Irradiation Target, and Plasma-Emitted Light: First Embodiment

4.1 Configuration

Figure 2:
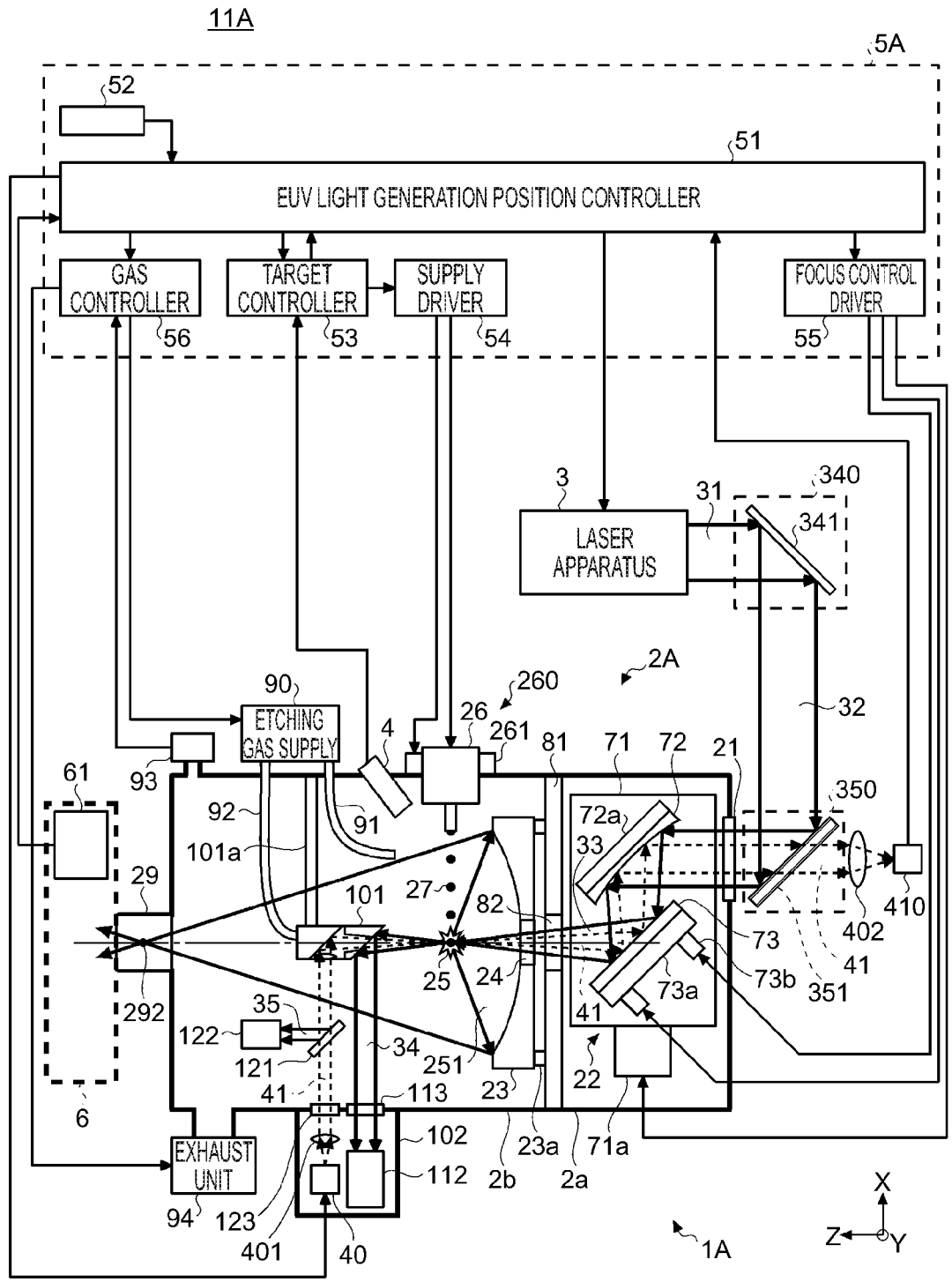
FIG. 2 schematically illustrates an example of the configuration of an EUV light generation system according to a first embodiment of this disclosure.

FIG. 2 schematically illustrates an example of the configuration of an EUV light generation system 11A according to a first embodiment. As shown in FIG. 2, the EUV light generation system 11A may include an EUV light generation apparatus LA and the laser apparatus 3.

The laser apparatus 3 may be configured to output the pulse laser beam 31 at a predetermined repetition rate. When the laser apparatus 3 includes $CO_2$ gas as a gain medium, the wavelength of the pulse laser beam 31 may be around 10.6 μm.

The EUV light generation apparatus 1A may include the beam delivery unit 340, a beam adjusting unit 350, a chamber 2A, and an EUV light generation controller 5A.

The beam delivery unit 340 may include a high-reflection mirror 341 for defining a direction into which the pulse laser beam 32 travels. The high-reflection mirror 341 may be coated with a film configured to reflect the pulse laser beam 31 with high reflectance. The beam delivery unit 340 may further include an actuator (not separately shown) for adjusting the position and the orientation of the high-reflection mirror 341. The beam delivery unit 340 may be positioned to direct the pulse laser beam 31 toward the beam adjusting unit 350 as the pulse laser beam 32.

The beam adjusting unit 350 may include a dichroic mirror 351. The dichroic mirror 351 may be coated on a first surface thereof with a film configured to reflect the pulse laser beam 32 with high reflectance and configured to transmit a guide beam 41 with high transmittance. Further, the dichroic mirror 351 may be coated on a second surface thereof with a film configured to transmit the guide beam 41 with high transmittance. The dichroic mirror 351 may be positioned such that the pulse laser beam 32 is incident on the first surface. The dichroic mirror 351 may have a substrate which, for example, is made of diamond.

The chamber 2A may include the window 21, the laser beam focusing optical system 22, a target supply unit 260, the target sensor 4, the EUV collector mirror 23, and the connection part 29. The chamber 2A may also include an etching gas supply unit 90, manometer 93, and an exhaust unit 94. Further, the EUV light generation apparatus 1A may include an optical detection unit that includes an imaging optical system 402 and an image sensor 410. The window 21 may be coated with a film configured to reduce reflectance of the pulse laser beam 32 incident thereon.

The laser beam focusing optical system 22 may include a laser beam focusing mirror 72 and a high-reflection mirror 73. The laser beam focusing optical system 22 may further include a plate 71, a plate moving mechanism 71a, a mirror holder 72a, and a holder 73a provided with an automatic tilt mechanism 73b. The laser beam focusing mirror 72 may be an off-axis paraboloidal mirror, and may be mounted to the plate 71 through the mirror holder 72a. The high-reflection mirror 73 may be mounted to the plate 71 through the holder 73a. The plate moving mechanism 71a may be configured to move the laser beam focusing mirror 72 and the high-reflection mirror 73 along with the plate 71.

The plate moving mechanism 71a may be configured to move the plate 71 to thereby adjust the focus of the pulse laser beam 33. The holder 73a may be configured to adjust the tilt angles of the high-reflection mirror 73 to thereby adjust the focus of the pulse laser beam 33. These adjustments may be made under the control of the EUV light generation controller 5A, which will be described in detail later.

The target supply unit 260 may include the droplet generator 26 and a two-axis moving mechanism 261. The droplet generator 26 may be positioned to output the droplets 27 toward the plasma generation region 25. The two-axis moving mechanism 261 may be configured to move the droplet generator 26 under the control of the EUV light generation controller 5A, to thereby adjust the position to which the droplets 27 are supplied.

The chamber 2A may further include a guide beam output device 40, a collimator 401, a mirror unit 101, a beam dump 112, a dichroic mirror 121, and a beam dump 122.

The mirror unit 101 may include first and second reflective surfaces. The first reflective surface may be arranged upstream (i.e., toward the laser apparatus 3) from the second reflective surface. A through-hole may be formed in the first reflective surface. The mirror unit 101 may be supported by a mirror holder 101a. The beam dump 112, the guide beam output device 40, and the collimator 401 may be housed in a sub-chamber 102. The sub-chamber 102 is optically connected to the chamber 2A through windows 113 and 123.

The guide beam output device 40 may be configured to output a guide beam 41. The guide beam output device 40 may be a semiconductor laser. The guide beam output device 40 is not limited to a laser, but may be an incoherent light source, such as a light emitting diode (LED). The guide beam 41 may be a pulse beam or a continuous wave beam. The wavelength of the guide beam 41 may be shorter than the wavelength of the pulse laser beam 31. For example, the guide beam 41 may be visible radiation, and the wavelength thereof may, for example, be around 500 nm. The guide beam 41 may preferably be at a wavelength suitable for photosensitivity of the image sensor 410, which will be described in detail later. The collimator 401 may be provided in a beam path of the guide beam 41 outputted from the guide beam output device 40.

The imaging optical system 402 may include one or more imaging lenses. The imaging optical system 402 may be positioned to focus the guide beam 41 on the photosensitive surface of the image sensor 410. The image sensor 410 may be a two-dimensional sensor, such as a charge-coupled device (CCD) or a position-sensitive device (PSD).

In the above-described configuration, an adjustment may be made such that the axis of the beam path of the guide beam 41 reflected by the mirror unit 101 substantially coincides with the axis of the beam path of the pulse laser beam 33 traveling through the plasma generation region 25.

The EUV light generation controller 5A may include an EUV light generation position controller 51, a reference clock generator 52, a target controller 53, a target supply driver 54, a laser beam focus position control driver 55, and a gas controller 56. The EUV light generation position controller 51 may be connected to the reference clock generator 52, the laser beam focus position control driver 55, the gas controller 56, the target controller 53, the laser apparatus 3, the exposure apparatus controller 61 (of the exposure apparatus 6), the guide beam output device 40, and the image sensor 410. The target controller 53 may be connected to the target supply driver 54 and the target sensor 4. The target supply driver 54 may be connected to the target supply unit 260. The laser beam focus position control driver 55 may be connected to the laser beam focusing optical system 22. The gas controller 56 may be connected to the etching gas supply unit 90, the manometer 93, and the exhaust unit 94.

The interior of the chamber 2A may be divided into an upstream space 2a and a downstream space 2b by a partition 81. The plasma generation region 25 may be set inside the downstream space 2b. The partition 81 may serve to reduce the amount of debris of the target material, generated in the plasma generation region 25 and entering the upstream space 2a. The partition 81 may have a communication hole 82 formed therein, through which the pulse laser beam 33 and the guide beam 41 may pass. The communication hole 82 may preferably be aligned with the through-hole 24 formed in the EUV collector mirror 23. The EUV collector mirror 23 may be fixed to the partition 81 through a holding unit 23a.

4.2 Operation

The operation of the EUV light generation system 11A shown in FIG. 2 will now be described. The EUV light generation system 11A may operate under the control of the EUV light generation controller 5A. The EUV light generation controller 5A may receive a request from the exposure apparatus controller 61 regarding a position at which the EUV light is to be generated (hereinafter, referred to as an EUV light generation request position) or the plasma generation region 25. The EUV light generation controller 5A may then control each of its components so that the EUV light is generated at the EUV light generation request position. Alternatively, the EUV light generation controller 5A may control each component so that the EUV light generation request position falls within the plasma generation region 25.

The EUV light generation controller 5A may cause the guide beam output device 40 to oscillate, so that the guide beam output device 40 may output the guide beam 41. The guide beam 41 may then be incident on the collimator 401 and be collimated by the collimator 401. The collimated guide beam 41 may enter the chamber 2A through the window 123.

The guide beam 41 having entered the chamber 2A may be reflected toward the plasma generation region 25 by the second surface of the mirror unit 101. The second surface of the mirror unit 101 may be configured such that the guide beam 41 reflected thereby is focused in the plasma generation region 25. Here, the axis of the beam path of the guide beam 41 reflected by the second surface may substantially coincide with the axis of the beam path of the pulse laser beam 33 to be focused in the plasma generation region 25.

Thereafter, the guide beam 41 may enter the laser beam focusing optical system 22 and be collimated thereby. Then, the guide beam 41 may enter the beam adjusting unit 350. The guide beam 41 that has entered the beam adjusting unit 350 may be transmitted through the dichroic mirror 351, and be focused on the photosensitive surface of the image sensor 410 by the imaging optical system 402. Thus, the guide beam 41 may be imaged on the photosensitive surface of the image sensor 410. This image detected by the image sensor 410 may include an image of the droplet 27. The image sensor 410 may send this image data to the EUV light generation position controller 51. Here, the spot size of the guide beam 41 may preferably be adjusted such that the image of the droplet 27 overlaps the image of the guide beam 41 so as to be detected inside an image of the guide beam 41. The spot size of the guide beam 41 may be equal to or larger than the spot size of the pulse laser beam 33.

The image detected by the image sensor 410 may also include an image of the light 251. That is, a part of the light 251 emitted in the plasma generation region 25 may enter the image sensor 410, through the through-hole 24 in the EUV collector mirror 23, the laser beam focusing optical system 22, the window 21, the beam adjusting unit 350, and the imaging optical system 402. The image sensor 410 may send the image data of the detected light 251 to the EUV light generation position controller 51.

Upon receiving the image data of the guide beam 41 from the image sensor 410, the EUV light generation position controller 51 may calculate the center of the image of the guide beam 41. The EUV light generation position controller 51 may then control the laser beam focusing optical system 22 through the laser beam focus position control driver 55 such that the center of the image of the guide beam 41 coincides with a predetermined target position (the EUV light generation request position).

The laser beam focus position control driver 55 may send driving signals to the automatic tilt mechanism 73b and the plate moving mechanism 71a, respectively, under the control of the EUV light generation position controller 51. The automatic tilt mechanism 73b may control the tilt angles of the high-reflection mirror 73 in $\theta x$ and $\theta y$ directions based on the driving signal received from the laser beam focus position control driver 55. The plate moving mechanism 71a may move the plate 71 in the Z-direction based on the driving signal from the laser beam focus position control driver 55.

When the image of the droplet 27 is contained in the image of the guide beam 41, the EUV light generation position controller 51 may calculate the center of the image of the droplet 27. The EUV light generation position controller 51 may then control the target supply unit 260 through the target controller 53 and the target supply driver 54 such that the center of the droplet 27 coincides with the EUV light generation request position. The target supply driver 54 may send a driving signal to the two-axis moving mechanism 261 under the control of the target controller 53. The two-axis moving mechanism 261 may move the droplet generator 26 in the X- and Y-directions based on the driving signal from the target supply driver 54. Further, the target supply driver 54 may adjust the timing at which an output signal of the droplet 27 is sent to the droplet generator 26 based on a timing control from the target controller 53.

The EUV light generation position controller 51 may also receive the image of the light 251 from the image sensor 410. Upon receiving the image of the light 251, the EUV light generation position controller 51 may calculate the center of the image of the light 251. Then, the EUV light generation position controller 51 may compare the calculated center of the image of the light 251 with the EUV light generation request position. Based on a result of the comparison, the EUV light generation position controller 51 may control the EUV light generation system 11A.

The EUV light generation controller 5A may receive an EUV light generation request signal from the exposure apparatus controller 61. Upon receiving the EUV light generation request signal, the EUV light generation controller 5A may input the EUV light generation request signal to the target controller 53. Upon receiving the EUV light generation request signal, the target controller 53 may send the output signal of the droplet 27 to the droplet generator 26 of the target supply unit 260 through the target supply driver 54.

The target sensor 4 may detect the position and the timing at which the droplet 27 passes through a predetermined region. The detected position and timing values may be inputted to the target controller 53. The target controller 53 may then control the target supply unit 260 through the target supply driver 54 in accordance with the inputted position and timing values. Further, the target controller 53 may send the inputted values to the EUV light generation position controller 51. The EUV light generation position controller 51 may send a trigger signal to the laser apparatus 3 in accordance with the inputted values so that the droplet 27 is irradiated with the pulse laser beam 33 at a timing at which the droplet 27 reaches EUV light generation request position. The laser apparatus 3 may be configured to output the pulse laser beam 31 at a timing delayed for a predetermined time from the trigger signal.

The pulse laser beam 31 may travel through the beam delivery unit 340 and the beam adjusting unit 350, and then enter the chamber 2A through the window 21. The pulse laser beam 32 may then be focused on the droplet 27 in the plasma generation region 25 by the laser beam focusing optical system 22.

Upon being irradiated with the pulse laser beam 33, the droplet 27 may be turned into plasma, and the light 251 that includes the EUV light may be emitted from the plasma. The EUV collector mirror 23 may selectively reflect the EUV light of the light 251. The reflected EUV light may be focused in the intermediate focus region 292 and be outputted to the exposure apparatus 6.

A part of the pulse laser beam 33, the light 251, and the EUV light may be reflected by the first reflective surface of the mirror unit 101 as light 34. The light 34 may then be transmitted through the window 113 and be absorbed by the beam dump 112.

Another part of the pulse laser beam 33, the light 251, and the EUV light may be reflected by the second reflective surface of the mirror unit 101 as light 35. The dichroic mirror 121 provided in the path of the light 35 may reflect a part of the light 35. The reflected part of the light 35 may be absorbed by the beam dump 122.

When the target material includes metal, debris of the target material may be generated when the target material is turned into plasma. The debris may be deposited on the EUV collector mirror 23, the mirror unit 101, and so forth. The etching gas supply unit 90 may be configured to supply an etching gas for etching the deposited debris through introduction pipes 91 and 92 toward the reflective surface of the EUV collector mirror 23 or into the mirror unit 101. When tin (Sn) is used as the target material, a gas containing a hydrogen gas or hydrogen radicals may be used as the etching gas.

The etching gas supply unit 90 may be configured to supply the etching gas into the chamber 2A under the control of the EUV light generation controller 5A. The etching gas may be introduced toward the reflective surface of the EUV collector mirror 23 through the introduction pipe 91. Similarly, the etching gas may be introduced into the mirror unit 101 through the introduction pipe 92.

The manometer 93 may be configured to measure the pressure inside the chamber 2A. The manometer 93 may send the measured pressure value to the EUV light generation controller 5A. The exhaust unit 94 may discharge the gas inside the chamber 2A under the control of the EUV light generation controller 5A.

The gas controller 56 may control the etching gas supply unit 90 and the exhaust unit 94 based on the pressure value inputted from the manometer 93 so that the gas pressure inside the chamber 2A is retained at a predetermined pressure while ensuring that a sufficient amount of gas is introduced into the chamber 2A.

Hereinafter, the image of the guide beam 41 and the image of the light 251, which are imaged on the image sensor 410 will be discussed. In the description to follow, it is assumed that the axis of the beam path of the guide beam 41 is adjusted to coincide with the axis of the beam path of the pulse laser beam 33. Further, a target position at which the droplet 27 is to be irradiated with the pulse laser beam 33 is the intersection (i.e., origin o) of the X-axis and the Y-axis in each of FIGS. 3 through 6.

Figure 3:
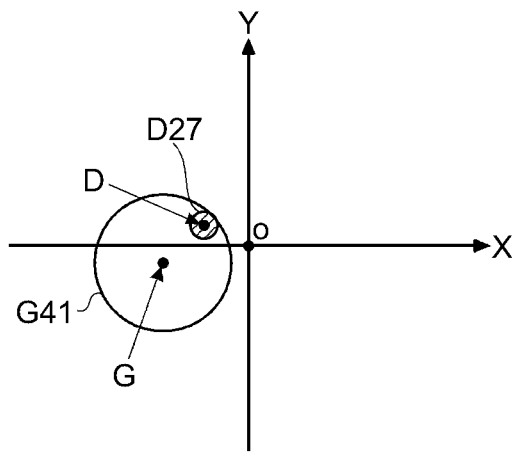
FIG. 3 shows an example of an image to be detected by an image sensor in a case where the center of a guide beam and the center of a droplet do not coincide with an origin when the droplet is irradiated with a pulse laser beam in the first embodiment.

FIG. 3 shows an example of an image to be detected by the image sensor 410 in a case where the center of the guide beam 41 and the center of the droplet 27 do not coincide with the origin o when the droplet 27 is irradiated with the pulse laser beam 33. In the example shown in FIG. 3, the center G of an image G41 of the guide beam 41 does not coincide with the origin o. Similarly, the center D of an image D27 of the droplet 27 does not coincide with the origin o. The position of the center G and the position of the center D may, for example, be obtained through various methods (e.g., by calculating the centers from the beam intensity distribution in the images acquired by the image sensor 410). Alternatively, the centroids may be used in place of the centers.

Figure 4:
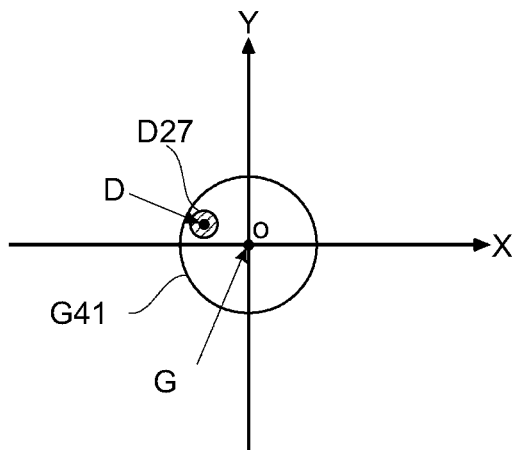
FIG. 4 shows an example of an image to be detected by an image sensor after a laser beam focusing optical system is adjusted in the first embodiment.

FIG. 4 shows an example of an image to be detected by the image sensor 410 after the laser beam focusing optical system 22 is adjusted. As shown in FIG. 4, after the laser beam focusing optical system 22 is adjusted, the center G of the image G41 may substantially coincide with the origin o.

Figure 5:
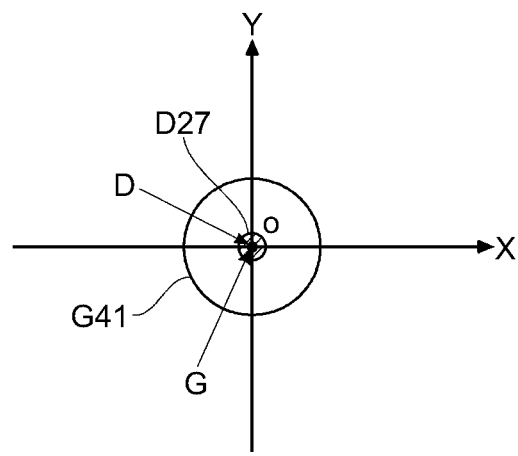
FIG. 5 shows an example of an image to be detected by an image sensor after a target supply unit is adjusted in the first embodiment.

FIG. 5 shows an example of an image to be detected by the image sensor 410 after the target supply unit 260 is adjusted. As shown in FIG. 5, after the target supply unit 260 is adjusted, the center D of the image D27 may substantially coincide with the origin o.

Figure 6:
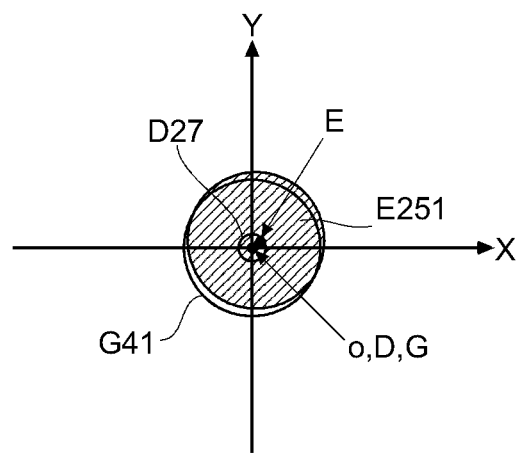
FIG. 6 shows an example of an image to be detected by an image sensor when the droplet is irradiated with the pulse laser beam in the state shown in FIG. 5.

FIG. 6 shows an example of an image to be detected by the image sensor 410 when the droplet 27 is irradiated with the pulse laser beam 33 in the state shown in FIG. 5. As shown in FIG. 6, after the laser beam focusing optical system 22 and the target supply unit 260 are adjusted, the center G of the image G41 and the center D of the image D27 may substantially coincide with the origin o. Accordingly, the center E of an image E251 of the light 251 obtained when the droplet 27 is irradiated with the pulse laser beam 33 under the aforementioned state may be at or around the origin o. Since the image E251 of the light 251 can be obtained with the above-described configuration, the EUV light may be generated at or around the origin by repeatedly adjusting the laser beam focusing optical system 22 and the target supply unit 260.

4.3 Effect

With the above-described configuration and operation, the axis of the beam path of the pulse laser beam 33 may be made to substantially coincide with the axis of the beam path of the guide beam 41 at a predetermined position. Further, the image of the guide beam 41 may be detected by the image sensor 410, and this image may include the image of the droplet 27. Accordingly, the focus of the pulse laser beam 33 and the position of the droplet 27 at the time of being irradiated with the pulse laser beam 33 may be identified from the image of the guide beam 41. Thus, the focus of the pulse laser beam 33 and the position to which and the timing at which the droplet 27 is supplied may be controlled based on a result of the detection. As a result, generation of the EUV light may be controlled with high precision.

Further, the guide beam output device 40 may output the guide beam 41 even while the laser apparatus 3 is not in operation. Thus, the focus of the pulse laser beam 33 may be controlled without putting the laser apparatus 3 into operation.

According to the first embodiment, the guide beam 41 may be focused in the target position at which the droplet 27 is to be irradiated with the pulse laser beam 33. Further, the image of the guide beam 41 at the target position may be detected through the laser beam focusing optical system 22 and the imaging optical system 402. As a result, the position at which the pulse laser beam 33 is focused, the position of the droplet 27 being irradiated with the pulse laser beam 33, and the target position may be detected simultaneously. Then, the focus of the laser beam focusing optical system 22 and the position of the droplet 27 may be controlled based on the detection result. Accordingly, the focus of the laser beam focusing optical system 22 and the position of the droplet 27 may be controlled with high precision to the desired target position. As a result, the droplet 27 may be irradiated with the pulse laser beam 33 stably, and the EUV light may be generated at the desired target position with high precision.

4.4 Flowchart

Figure 7:
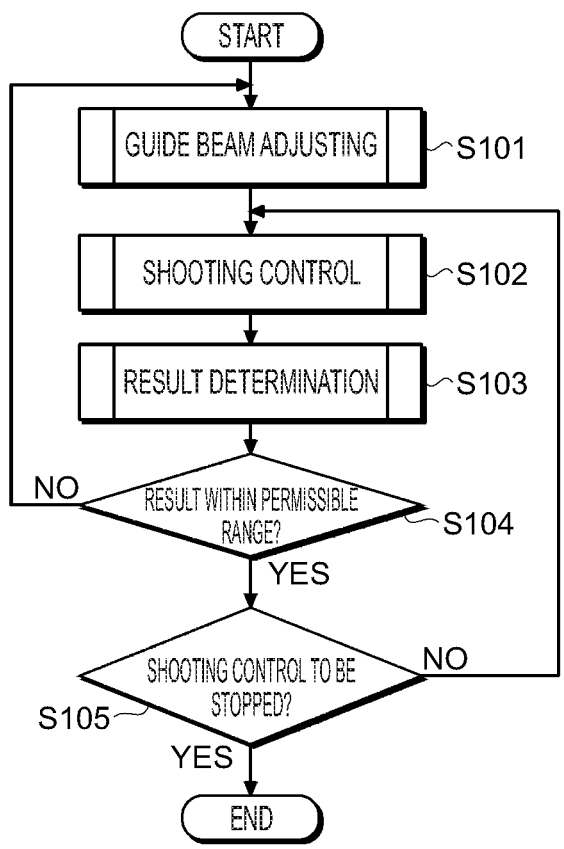
FIG. 7 is a flowchart showing an overall operation of an exemplary EUV light generation controller according to the first embodiment.
Figure 8:
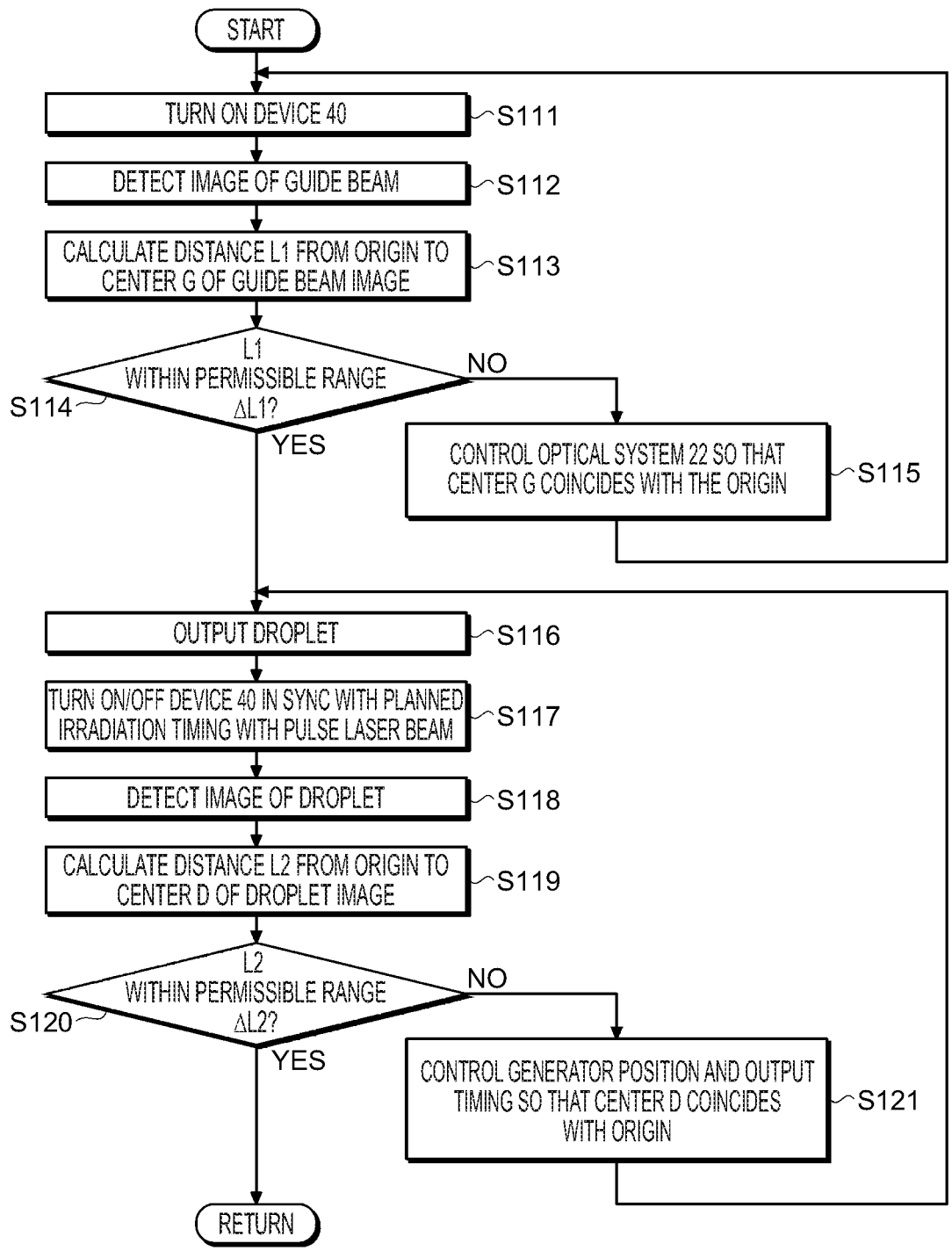
FIG. 8 is a flowchart showing an example of a guide beam adjusting subroutine of FIG. 7.
Figure 9:
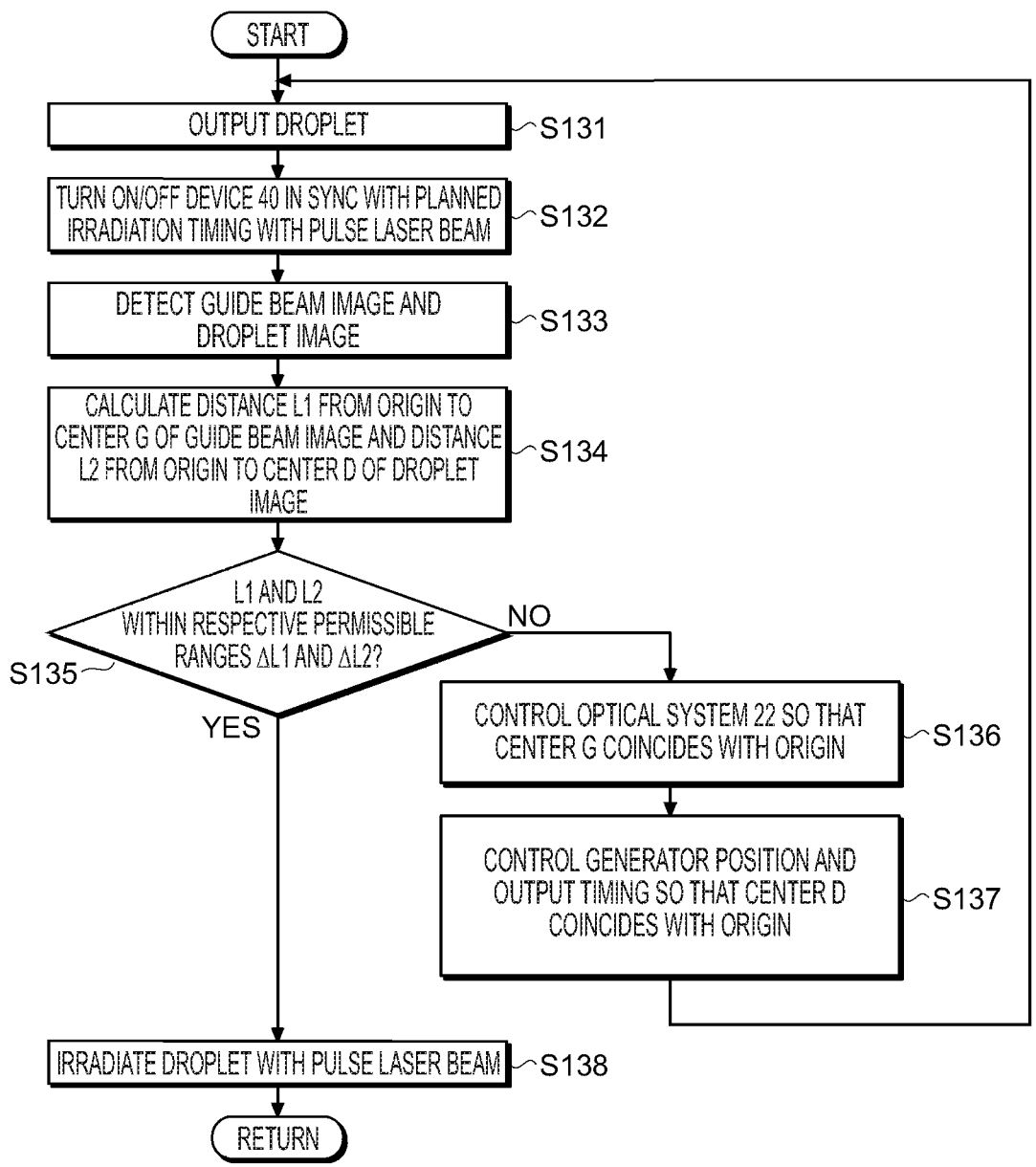
FIG. 9 is a flowchart showing an example of a shooting control subroutine of FIG. 7.
Figure 10:
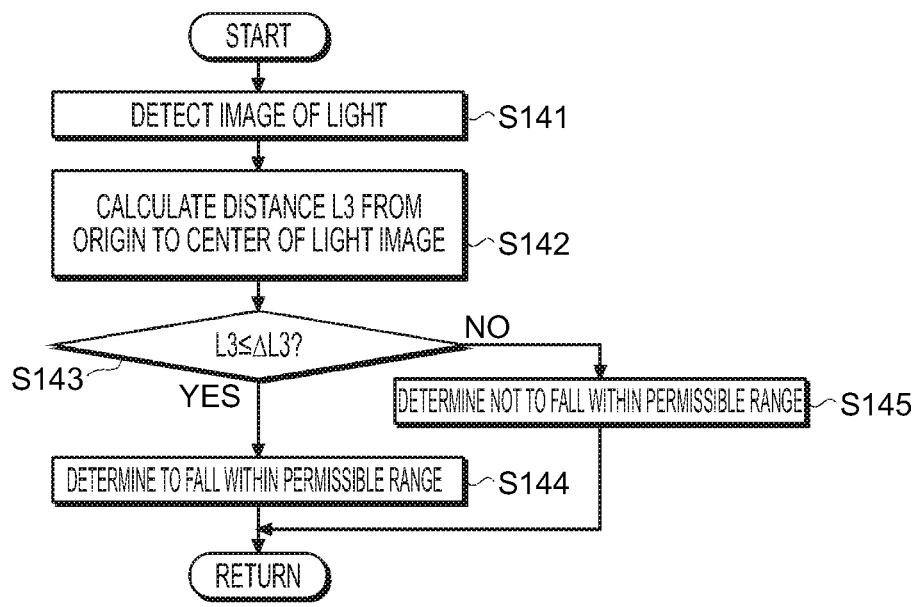
FIG. 10 is a flowchart showing an example of a result determination subroutine of FIG. 7.

The operation of the EUV light generation controller 5A of the first embodiment will now be described in detail with reference to the drawings. FIG. 7 is a flowchart showing the overall operation of the EUV light generation controller 5A of the first embodiment. FIG. 8 is a flowchart showing an example of a guide beam adjusting subroutine of FIG. 7. FIG. 9 is a flowchart showing an example of a shooting control subroutine of FIG. 7. FIG. 10 is a flowchart showing an example of a result determination subroutine of FIG. 7.

The operation shown in FIG. 7 may be carried out when the EUV light generation controller 5A receives an instruction for a burst operation from an external apparatus, such as the exposure apparatus controller 61, or when the EUV light generation controller 5A is started.

As shown in FIG. 7, the EUV light generation controller 5A may first carry out the guide beam adjusting subroutine (Step S101). Then, the EUV light generation controller 5A may carryout the shooting control subroutine to generate the light 251 (Step S102). Subsequently, the EUV light generation controller 5A may carry out the result determination subroutine to determine whether or not the generation result of the light 251 through the shooting control subroutine in Step S102 falls within a permissible range (Step S103). When the generation result of the light 251 is determined not to fall within the permissible range based on the result from Step S103 (Step S104; NO), the EUV light generation controller 5A may return to Step S101 and repeat the subsequent steps. When the generation result of the light 251 is determined to fall within the permissible range based on the result from Step S103 (Step S104; YES), the EUV light generation controller 5A may determine whether or not to stop the shooting control resulting in the generation of the light 251 (Step S105). When the shooting control is to be stopped (Step S105; YES), the EUV light generation controller 5A may terminate the operation shown in FIG. 7. On the other hand, when the shooting control is not to be stopped (Step S105; NO), the EUV light generation controller 5A may return to Step S102 and repeat the subsequent steps.

With reference to FIG. 8, in the guide beam adjusting subroutine in Step S101, the EUV light generation controller 5A may first turn on the guide beam output device 40 (Step S111). Then, the EUV light generation controller 5A may operate the image sensor 410 to detect the image G41 of the guide beam 41 (Step S112). Subsequently, the EUV light generation controller 5A may analyze the image inputted from the image sensor 410 to calculate a distance L1 between the center G of the image G41 and the origin o (Step S113).

Then, the EUV light generation controller 5A may determine whether or not the distance L1 falls within a permissible range ΔL1 (Step S114). The permissible range ΔL1 may be set in advance or may be inputted from an external apparatus, such as the exposure apparatus controller 61. When the distance L1 does not fall within the permissible range ΔL1 (Step S114; NO), the EUV light generation controller 5A may actuate the laser beam focusing optical system 22 so that the center G of the image G41 coincides with the origin o (Step S115). Thereafter, the EUV light generation controller 5A may return to Step S111.

On the other hand, when the distance L1 falls within the permissible range ΔL1 (Step S114; YES), the EUV light generation controller 5A may actuate the target supply unit 260 to output the droplet 27 (Step S116). Subsequently, the EUV light generation controller 5A may turn on and off the guide beam output device 40 in synchronization with the planned irradiation timings with the pulse laser beam 33 (Step S117). Then, the EUV light generation controller 5A may detect the image D27 of the droplet 27 from the image G41 of the guide beam 41 inputted by operating the image sensor 410 (Step S118). Subsequently, the EUV light generation controller 5A may analyze the image D27 of the droplet 27 to calculate a distance L2 between the center D of the image D27 and the origin o (Step S119).

Then, the EUV light generation controller 5A may determine whether or not the distance L2 falls within a permissible range ΔL2 (Step S120). The permissible range ΔL2 may be set in advance or may be inputted from an external apparatus, such as the exposure apparatus controller 61. When the distance L2 does not fall within the permissible range ΔL2 (Step S120; NO), the EUV light generation controller 5A may actuate the two-axis moving mechanism 261 of the target supply unit 260 so that the center D of the image D27 coincides with the origin o (Step S121). At this point, the EUV light generation controller 5A may also correct the timing at which the droplet 27 is outputted from the droplet generator 26. Thereafter, the EUV light generation controller 5A may return to Step S116. On the other hand, when the distance L2 falls within the permissible range ΔL2 (Step S120; YES), the EUV light generation controller 5A may return to the operation shown in FIG. 7.

Through the guide beam adjusting subroutine shown in FIG. 8, the focus of the laser beam focusing optical system 22 and the position of the droplet 27 may be adjusted to the origin o.

With reference to FIG. 9, in the shooting control subroutine in Step S102 of FIG. 7, the EUV light generation controller 5A may first cause the droplet 27 to be outputted (Step S131). Subsequently, the EUV light generation controller 5A may turn on and off the guide beam output device 40 in synchronization with the planned irradiation timing with the pulse laser beam 33 (Step S132). Then, the EUV light generation controller 5A may detect the image G41 of the guide beam 41 and the image D27 of the droplet 27 from the image inputted by operating the image sensor 410 (Step S133). Then, the EUV light generation controller 5A may analyze the image G41 and the image D27. Thus, the EUV light generation controller 5A may calculate the distance L1 between the center G of the image G41 and the origin o and the distance L2 between the center D of the image D27 and the origin o (Step S134).

Subsequently, the EUV light generation controller 5 may determine whether or not the calculated distances L1 and L2 fall within the permissible ranges ΔL1 and ΔL2, respectively (Step S135). When the distances L1 and L2 do not fall within the respective permissible ranges ΔL1 and ΔL2 (Step S135; NO), the EUV light generation controller 5A may actuate the laser beam focusing optical system 22 so that the center G of the image G41 coincides with the origin o (Step S136). Further, the EUV light generation controller 5A may actuate the two-axis moving mechanism 261 of the target supply unit 260 so that the center D of the image D27 coincides with the origin o (Step S115). At this point, the EUV light generation controller 5A may also correct the timing at which the droplet 27 is outputted from the droplet generator 26 (Step S137). Thereafter, the EUV light generation controller 5A may return to Step S131. Note that only one of the Steps S136 and S137 may be carried out as necessary.

On the other hand, when the distances L1 and L2 fall within the respective permissible ranges ΔL1 and ΔL2 (Step S135; YES), the EUV light generation controller 5A may actuate the laser apparatus 3 so that the droplet 27 is irradiated with the pulse laser beam 33 (Step S138). Thus, the light 251 may be generated at the desired target position. Thereafter, the EUV light generation controller 5A may return to the operation shown in FIG. 7.

With reference to FIG. 10, in the result determination subroutine in Step S103 of FIG. 7, the EUV light generation controller 5A may first operate the image sensor 410, so that the image E251 of the light 251 generated through the shooting control subroutine may be detected (Step S141). Subsequently, the EUV light generation controller 5A may analyze the image E251 of the light 251 to calculate a distance L3 (e.g., $L3=\sqrt{x^2+y^2}$) between the center E of the image E251 and the origin o (Step S142).

Then, the EUV light generation controller 5A may determine whether or not the distance L3 falls within a permissible range ΔL3 (Step S143). The permissible range ΔL3 may be set in advance or may be inputted from an external apparatus, such as the exposure apparatus controller 61. When the distance L3 falls within the permissible range ΔL3 (Step S143; YES), the EUV light generation controller 5A may make a determination that the distance L3 is within the permissible range (Step S144), and return to the operation shown in FIG. 7. On the other hand, when the distance L3 does not fall within the permissible range ΔL3 (Step S143; NO), the EUV light generation controller 5A may make a determination that the distance L3 does not fall within the permissible range (Step S145), and return to the operation shown in FIG. 7.

With the above-described operation, the position at which the light 251 is generated may be controlled to fall within the permissible range.

Figure 11:
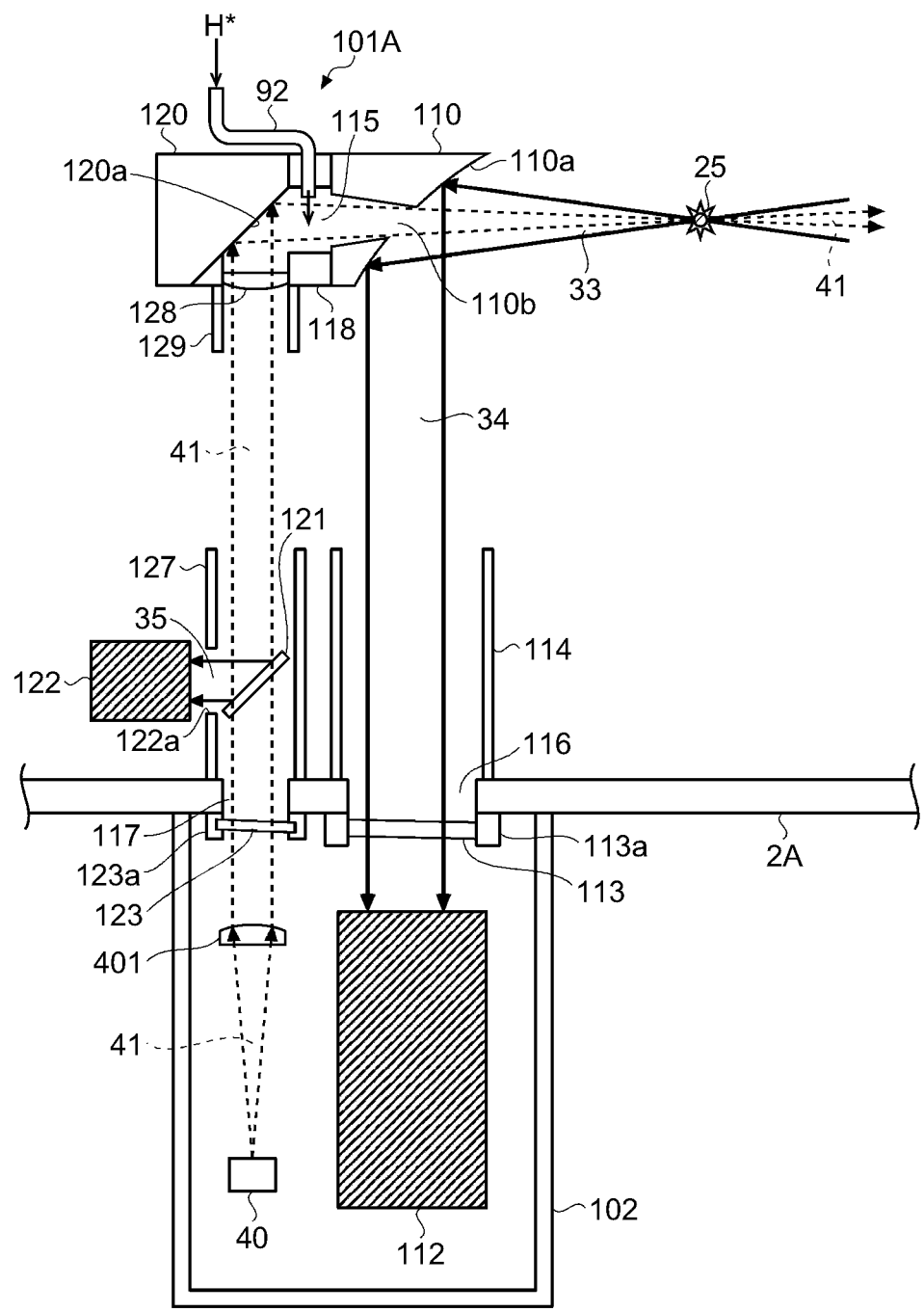
FIG. 11 schematically illustrates an example of the configuration of a mirror unit of a first modification and the peripheral components thereof.

5. Specific Examples of Mirror Unit
5.1 First Example
5.1.1 Configuration FIG. 11 schematically illustrates an example of the configuration of a mirror unit 101A as a first example and the peripheral components thereof. As shown in FIG. 11, the mirror unit 101A may include mirror blocks 110 and 120, a lens block 118, a focusing lens 128, and a baffle 129. The mirror block 110 may be provided upstream from the mirror block 120, that is, toward the plasma generation region 25.

The lens block 118 may be provided between the mirror block 110 and the mirror block 120. The focusing lens 128 and the baffle 129 may be fixed to the lens block 118. The lens block 118 may be hollow in shape so that the lens block 118 does not block the guide beam 41. The lens block 118 may be provided with a heat carrier pipe (not separately shown). A heat carrier may circulate inside the heat carrier pipe via a cooling device (not separately shown) and a pump (not separately shown) to suppress a rise in the temperature of the lens block 118 caused by the pulse laser beam and/or scattered rays of the pulse laser beam.

The base material of the mirror blocks 110 and 120 may be a material with high heat-conductivity, such as copper (Cu). Further, each of the mirror blocks 110 and 120 may be coated with a material, such as molybdenum (Mo), having low reactivity with the target material. Each of the mirror blocks 110 and 120 may be provided with a heat carrier pipe (not separately shown). A heat carrier may circulate inside the heat carrier pipe via a cooling device (not separately shown) and a pump (not separately shown) to suppress a rise in temperature of the mirror blocks 110 and 120.

One of the surfaces of the mirror block 110 may be processed into a reflective surface (first reflective surface), and may serve as an off-axis paraboloidal mirror 110a. A through-hole 110b may be formed in the center of the off-axis paraboloidal mirror 110a in a direction in which the guide beam 41 travels. A space 115, which is in communication with the through-hole 110b, may be defined by the lens block 118 and the mirror block 120. The mirror unit 101A may be positioned such that the focus of the off-axis paraboloidal mirror 110a substantially coincides with the plasma generation region 25.

Referring to FIG. 11, the light 34 reflected by the mirror block 110 may enter the sub-chamber 102 through the communication hole 116 formed in the chamber 2A. The communication hole 116 may be covered by the window 113. The window 113 may be formed of diamond, and coated with anti-reflective films for the wavelength of the pulse laser beam 33 on both sides thereof. The window 113 may be held by the window holder 113a attached to the outer wall of the chamber 2A. Further, the window 113 may preferably be arranged so that the light 34 is not incident normally thereon. A cylindrical baffle 114 may be provided on the inner wall of the chamber 2A so as to surround the window 113. Thus, deposition of debris onto the window 113 may be reduced. The baffle 114 may be provided with an introduction pipe (not separately shown) connected to the etching gas supply unit 90 (see FIG. 2), through which the etching gas flows. The inner diameter of the baffle 114 may preferably be larger than the diameter of the light 34 reflected by the off-axis paraboloidal mirror 110a. The light 34 that has entered the sub-chamber 102 through the window 113 may be absorbed by the beam dump 112. The beam dump 112 may be provided with an energy sensor for detecting the energy of the entering laser beam. A commercially available laser power meter head may be used as the beam dump 112. Cooling water (not separately shown) may circulate in the beam dump 112.

One of the surfaces of the mirror block 120 may be processed into a reflective surface (second reflective surface) 120a, and may be positioned to reflect the guide beam 41 at 45 degrees. The collimator 401, the window 123, the dichroic mirror 121, and the focusing lens 128 may be arranged in this order in a path of the guide beam 41 from the guide beam output device 40. A baffle 127 may preferably be provided so as to surround the window 123 and the dichroic mirror 121.

Referring to FIG. 11, the mirror block 120 may be positioned such that the guide beam 41 transmitted through the focusing lens 128 and reflected by the reflective surface 120a is focused in the plasma generation region 25. A part of the pulse laser beam 33, the light 251 (see FIG. 2), and the EUV light that have passed through the plasma generation region 25 may be reflected by the second reflective surface 120a as the light 35. The focusing lens 128 may serve to collimate the light 35. The focusing lens 128 may be made of diamond. A cylindrical baffle 129 may be provided on the outer wall of the lens block 118 so as to surround the focusing lens 128, so that deposition of debris onto the focusing lens 128 may be reduced. The baffle 129 may be provided with an introduction pipe (not separately shown) connected to the etching gas supply unit 90 (see FIG. 2), through which the etching gas flows.

The light 35 transmitted through the focusing lens 128 may be incident on the dichroic mirror 121. The dichroic mirror 121 may be coated with a film configured to transmit the guide beam 41 with high transmittance and reflect the light 35 with high reflectance. The dichroic mirror 121 may be made of diamond. The light 35 reflected by the dichroic mirror 121 may enter the beam dump 122 through a through-hole 122a formed in the baffle 127, and be absorbed by the beam dump 122. Cooling water (not separately shown) may circulate in the beam dump 122.

Referring to FIG. 11, the guide beam output device 40 and the collimator 401 may be provided inside the sub-chamber 102. The collimator 401 may collimate the guide beam 41 outputted from the guide beam output device 40. The guide beam 41 transmitted through the collimator 401 may enter the chamber 2A through a communication hole 117 formed in the chamber 2A. The communication hole 117 may be covered by the window 123. The window 123 may be formed of diamond, and coated with anti-reflective films for the wavelength sensitive to the image sensor 410 on both sides thereof. The window 123 may be held by a window holder 123a attached to the outer wall of the chamber 2A. The cylindrical baffle 127 may be provided on the inner wall of the chamber 2A so as to surround the window 123, so that deposition of debris onto the window 123 may be reduced. The baffle 127 may be provided with an introduction pipe (now shown) connected to the etching gas supply unit 90 (see FIG. 2), through which the etching gas flows.

The guide beam 41 transmitted through the dichroic mirror 121 may be incident on the reflective surface 120a of the mirror block 120 through the focusing lens 128. The guide beam 41 may be reflected by the reflective surface 120a and focused in the plasma generation region 25.

Referring to FIG. 11, a gas outlet of the introduction pipe 92 connected to the etching gas supply unit 90 (see FIG. 2) may be arranged in the space 115 inside the mirror unit 101A. The etching gas may be introduced into the space 115, whereby debris deposited on the reflective surface 120a and on a surface of the focusing lens 128 may be removed. Alternatively, an inert gas may be introduced into the space 115 from an inert gas supply unit (not separately shown) in order to prevent dust or the like from adhering onto the optical elements. In either case, a discharge port (not separately shown) may be provided in the sub-chamber 102 to discharge the introduced gas(es). When the etching gas is introduced into the space 115, an appropriate scrubber may be connected to the discharge port.

5.1.2 Operation

The operation of the configuration shown in FIG. 11 will now be described. The axis of the beam path of the guide beam 41 may coincide with the axis of the beam path of the pulse laser beam 33. The guide beam 41 outputted from the guide beam output device 40 may be collimated through the collimator 401. Thereafter, the guide beam 41 may be transmitted through the dichroic mirror 121 and the focusing lens 128, and be incident on the reflective surface 120a of the mirror block 120. The guide beam 41 reflected by the reflective surface 120a may pass through the space 115, be focused in the plasma generation region 25, and then enter the laser beam focusing optical system 22 (see FIG. 2).

Referring to FIG. 11, the guide beam 41 may be collimated through the laser beam focusing optical system 22. Thereafter, the guide beam 41 may be transmitted through the imaging optical system 402 (see FIG. 2). The cross-sectional image of the guide beam 41 at its focus may be transferred onto the photosensitive surface of the image sensor 410 (see FIG. 2) by the imaging optical system 402.

The center portion of the pulse laser beam 33 that has passed through the plasma generation region 25 may pass through the space 115, and be reflected by the reflective surface 120a. The reflected pulse laser beam 33 may be incident on the dichroic mirror 121 through the focusing lens 128, be reflected by the dichroic mirror 121 with high reflectance, and enter the beam dump 122.

The peripheral portion of the pulse laser beam 33 that has passed through the plasma generation region 25 may be reflected by the off-axis paraboloidal mirror 110a, and enter the beam dump 112 inside the sub-chamber 102 through the window 113.

Referring to FIG. 11, a part of the light 251 (see FIG. 2) emitted from plasma generated in the plasma generation region 25 may enter the laser beam focusing optical system 22 (see FIG. 2). The light 251 may be collimated through the laser beam focusing optical system 22. Thereafter, the light 251 may be transmitted through the imaging optical system 402 (see FIG. 2). The cross-sectional image of the light 251 at its focus may be transferred onto the photosensitive surface of the image sensor 410 through the imaging optical system 402.

Referring to FIG. 11, the etching gas supplied into the space 115 through the introduction pipe 92 from the etching gas supply unit 90 (see FIG. 2) may flow along the surfaces of the optical elements of the mirror unit 101A to the outside of the space 115. The surfaces of the optical elements may include the reflective surface 120a of the mirror block 120, the surface of the focusing lens 128, and so forth. Debris deposited on the surfaces of the optical elements may be etched by the etching gas.

The baffles 114, 129, and 127 may respectively serve to reduce the debris to be deposited on the surfaces of the window 113, the focusing lens 128, the dichroic mirror 121, and the window 123. The etching gas supply unit 90 (see FIG. 2) may cause the etching gas to flow along the surfaces of the optical elements through a pipe (not separately shown). Thus, debris deposited on the surfaces of the optical elements may be etched.

5.1.3 Effect

According to the first example, the beam path of the guide beam 41 and the beam path of the pulse laser beam 33 may be made to substantially coincide with each other. Further, the guide beam 41 and the light 251 may be detected by a single image sensor 410.

In addition, debris deposited on the surfaces of the optical elements in the mirror unit 101A may be etched. Thus, the guide beam 41 and the light 251 may be detected stably for a relatively long time.

When tin (Sn) is used as the target material, a hydrogen gas or hydrogen radicals may be used as the etching gas. The hydrogen gas or the hydrogen radicals may etch deposited Sn through the following chemical reaction:

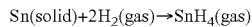

$$Sn(solid)+2H_2(gas) \rightarrow SnH_4(gas)$$

However, when the temperature reaches or exceeds 100° C., a reverse reaction may occur, and Sn may be deposited. Thus, the temperature of each optical element (e.g., mirror unit 101A) may preferably be controlled to fall within a range of 30° C. to 80° C., where the etching reaction rate is greater than the deposition reaction rate. The temperature of the mirror unit 101A may, for example, be controlled by controlling at least one of the temperature and the flow rate of the heat carrier circulating in the mirror unit 101A based on the detection value in a temperature sensor (not separately shown) attached to the mirror unit 101A.

5.2 Second Example
5.2.1 Configuration

Figure 12:
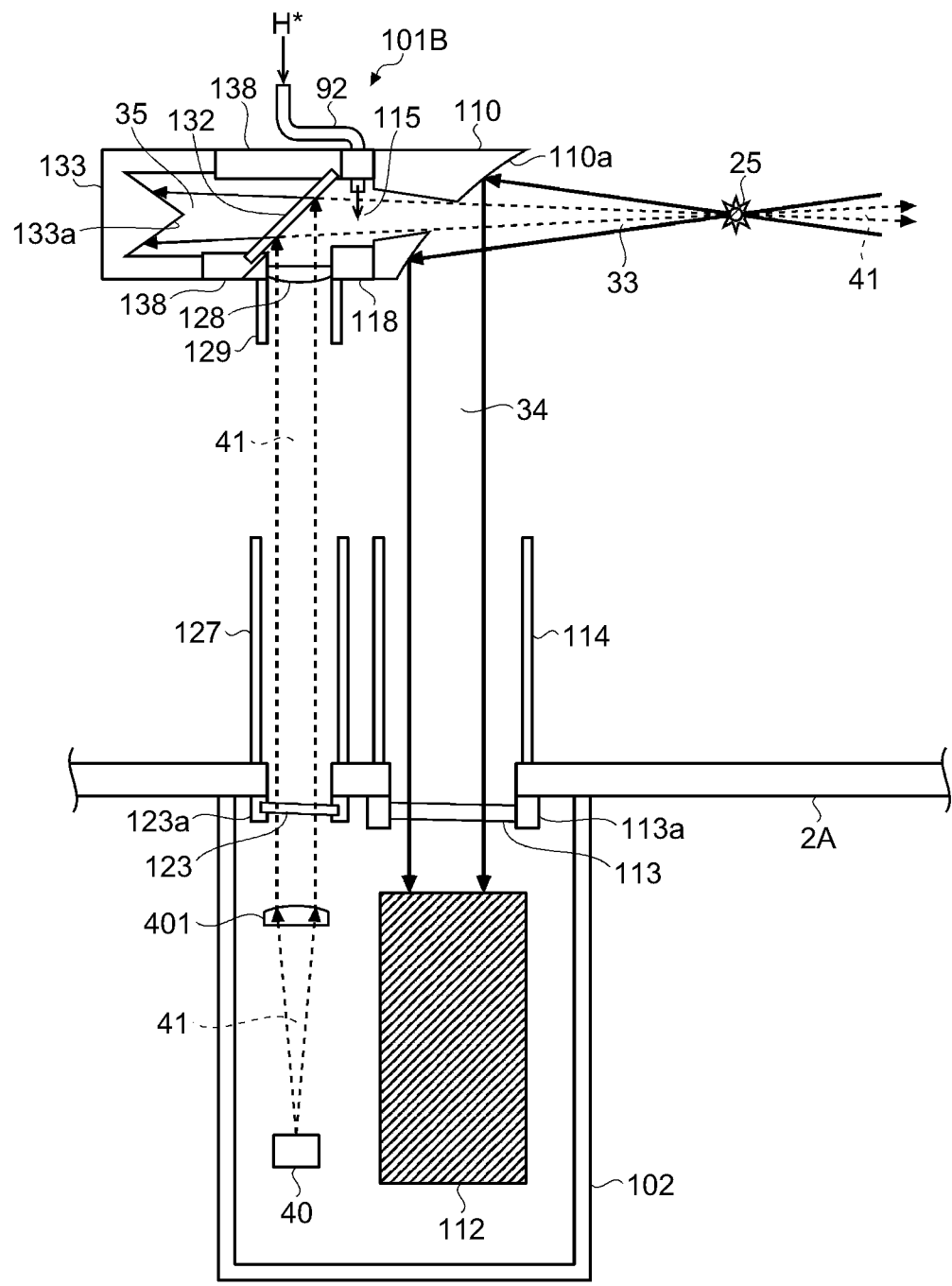
FIG. 12 schematically illustrates an example of the configuration of a mirror unit of a second modification and the peripheral components thereof.

FIG. 12 schematically illustrates an example of the configuration of a mirror unit 101B as a second example and the peripheral components thereof. As shown in FIG. 12, the mirror unit 101B may include the mirror block 110, the lens block 118, a dichroic mirror block 138, and a beam dump block 133.

Referring to FIG. 12, the mirror block 110 and the lens block 118 may be configured similarly to those shown in FIG. 11. A dichroic mirror 132 may be fixed to the dichroic mirror block 138. The space 115 may be formed inside the mirror unit 101B. The dichroic mirror 132 may be coated with a film configured to transmit the pulse laser beam 33 and a part of the light 251 (see FIG. 2) with high transmittance and reflect the guide beam 41 with high reflectance. The dichroic mirror 132 may preferably be made of diamond.

Here, referring to FIG. 12, the focusing lens 128 fixed to the lens block 118 may be made of a material that transmits the guide beam 41. A conical protrusion may be formed on an inner surface of the beam dump block 133 in order to absorb the pulse laser beam 33 and a part of the light 251 efficiently. The beam dump block 133 may be provided with a pipe (not separately shown), through which a heat carrier may circulate to suppress a rise in temperature of the beam dump block 133. The introduction pipe 92 from the etching gas supply unit 90 (see FIG. 2) may be connected to the mirror unit 101B so that the etching gas flows along the surfaces of the dichroic mirror 132 and the focusing lens 128.

5.2.2 Operation

The operation of the configuration shown in FIG. 12 will now be described. The axis of the beam path of the guide beam 41 may coincide with the axis of the beam path of the pulse laser beam 33. The guide beam 41 outputted from the guide beam output device 40 may be collimated through the collimator 401. Then, the guide beam 41 may be transmitted through the focusing lens 128, and be incident on the dichroic mirror 132. The guide beam 41 reflected by the dichroic mirror 132 may pass through the space 115, be focused in the plasma generation region 25, and then enter the laser beam focusing optical system 22 (see FIG. 2).

The guide beam 41 may be collimated through the laser beam focusing optical system 22. Thereafter, the guide beam 41 may be transmitted through the imaging optical system 402. The cross-sectional image of the guide beam 41 at its focus may be transferred onto the photosensitive surface of the image sensor 410 by the imaging optical system 402 (see FIG. 2).

The center portion of the pulse laser beam 33 that has passed through the plasma generation region 25 may pass through the space 115, be transmitted through the dichroic mirror 132, and be incident on the conical surface 133a of the beam dump block 133.

The peripheral portion of the pulse laser beam 33 that has passed through the plasma generation region 25 may be reflected by the off-axis paraboloidal mirror 110a, and enter the beam dump 112 inside the sub-chamber 102 through the window 113.

Referring to FIG. 12, a part of the light 251 (see FIG. 2) emitted from plasma generated in the plasma generation region 25 may enter the laser beam focusing optical system 22. The light 251 may be collimated through the laser beam focusing optical system 22 (see FIG. 2). Thereafter, the light 251 may be transmitted through the imaging optical system 402 (see FIG. 2). The cross-sectional image of the light 251 at its focus may be transferred onto the photosensitive surface of the image sensor 410 (see FIG. 2) by the imaging optical system 402.

The etching gas supplied into the space 115 through the introduction pipe 92 from the etching gas supply unit 90 may flow along the surfaces of the optical elements in the mirror unit 101B to the outside of the space 115. The surfaces of the optical elements may include the surface of the dichroic mirror 132, the surface of the focusing lens 128, and so forth. Debris deposited on the surfaces of the optical elements may be etched by the etching gas.

The baffles 114, 129, and 127 may respectively reduce the debris to be deposited on the surfaces of the window 113, the focusing lens 128, and the window 123. The etching gas supply unit 90 may cause the etching gas to flow along the surfaces of the optical elements through a pipe (not separately shown). Thus, debris deposited on the surfaces of the optical elements may be etched.

5.2.3 Effect

According to the second example, referring to FIG. 12, the dichroic mirror 132 and the beam dump block 133 may be provided in the mirror unit 101B. Accordingly, the amount of the pulse laser beam 33 and the light 251 (see FIG. 2) incident on the focusing lens 128 may be reduced. As a result, the focusing lens 128 need not have durability against the high power pulse laser beam 33, and need not be formed of diamond, which is relatively expensive.

5.3 Third Example
5.3.1 Configuration

Figure 13:
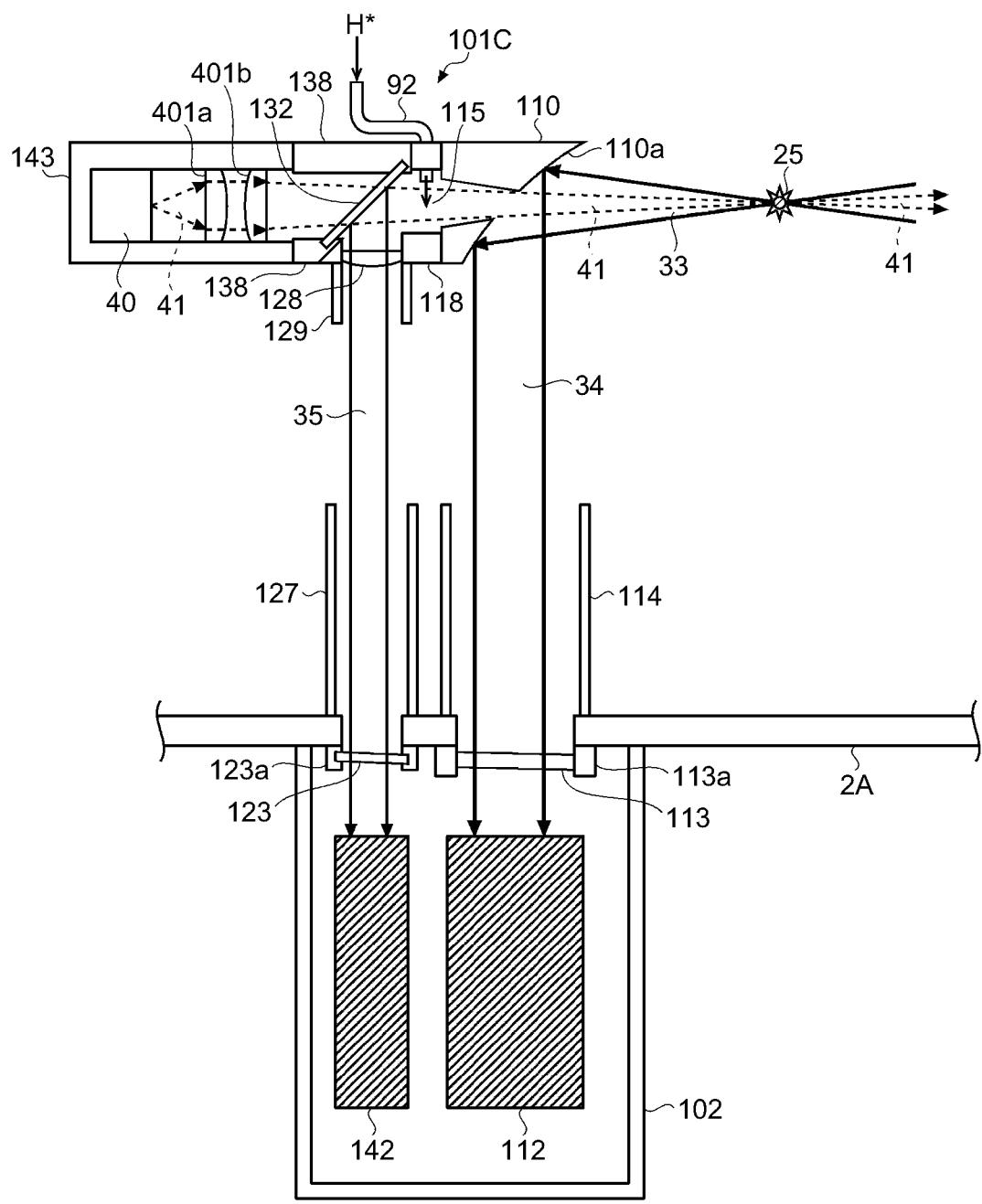
FIG. 13 schematically illustrates an example of the configuration of a mirror unit of a third modification and the peripheral components thereof.

FIG. 13 schematically illustrates an example of the configuration of a mirror unit 101C as a third example and the peripheral components thereof. As shown in FIG. 13, the mirror unit 101C may include the mirror block 110, the lens block 118, the dichroic mirror block 138, and a guide beam output device housing 143.

The mirror block 110 and the lens block 118 may be configured similarly to those shown in FIG. 11. The dichroic mirror 132 may be fixed to the dichroic mirror block 138. The space 115 may be formed inside the mirror unit 101C. The dichroic mirror 132 may be coated with a film configured to reflect the pulse laser beam 33 and a part of the light 251 (see FIG. 2) with high reflectance and transmit the guide beam 41 with high transmittance. The dichroic mirror 132 may preferably be made of diamond.

Referring to FIG. 13, the guide beam output device 40, a collimator 401a, and a focusing lens 401b may be housed in the guide beam output device housing 143. The guide beam 41 outputted from the guide beam output device 40 may be incident on the collimator 401a, and be collimated through the collimator 401a. Thereafter, the guide beam 41 may be incident on the focusing lens 401b, and be focused in the plasma generation region 25 by the focusing lens 401b through the dichroic mirror 132. Then, the guide beam 41 may enter the laser beam focusing optical system 22 (see FIG. 2).

Here, the lens block 118 to which the focusing lens 128 is fixed may be provided with a pipe (now shown), through which a heat carrier circulates to suppress a rise in temperature of the lens block 118 caused by the energy of the laser beam passing through the focusing lens 128. The introduction pipe 92 from the etching gas supply unit 90 (see FIG. 2) may be connected to the mirror unit 101C so that the etching gas flows along the surfaces of the dichroic mirror 132 and the focusing lens 128.

The beam dump 142 may be provided inside the sub-chamber 102. The pulse laser beam 33 and the light 251 (see FIG. 2) reflected by the dichroic mirror 132 (collectively, the light 35) may enter the beam dump 142 through the window 123.

5.3.2 Operation

The operation of the configuration shown in FIG. 13 will now be described. The axis of the beam path of the guide beam 41 may coincide with the axis of the beam path of the pulse laser beam 33. The guide beam 41 outputted from the guide beam output device 40 may be transmitted through the collimator 401a and the focusing lens 401b. Then, the guide beam 41 may be transmitted through the dichroic mirror 132, pass through the space 115, and be focused in the plasma generation region 25. Thereafter, the guide beam 41 may enter the laser beam focusing optical system 22 (see FIG. 2).

Referring to FIG. 13, the guide beam 41 may be collimated through the laser beam focusing optical system 22 (see FIG. 2). Thereafter, the guide beam 41 may be transmitted through the imaging optical system 402 (see FIG. 2). The cross-sectional image of the guide beam 41 at its focus may be transferred onto the photosensitive surface of the image sensor 410 (see FIG. 2) by the imaging optical system 402.

The center portion of the pulse laser beam 33 that has passed through the plasma generation region 25 may pass through the space 115, and be reflected by the dichroic mirror 132. The reflected pulse laser beam 33 may be transmitted through the window 123, and enter the beam dump 142 inside the sub-chamber 102.

Referring to FIG. 13, the peripheral portion of the pulse laser beam 33 that has passed through the plasma generation region 25 may be reflected by the off-axis paraboloidal mirror 110a, and enter the beam dump 112 inside the sub-chamber 102 through the window 113.

Referring to FIG. 13, a part of the light 251 (see FIG. 2) emitted from plasma generated in the plasma generation region 25 may enter the laser beam focusing optical system 22 (see FIG. 2). The light 251 may be collimated through the laser beam focusing optical system 22. Thereafter, the light 251 may be transmitted through the imaging optical system 402 (see FIG. 2). The cross-sectional image of the light 251 at its focus may be transferred onto the photosensitive surface of the image sensor 410 (see FIG. 2) by the imaging optical system 402.

The etching gas supplied into the space 115 through the introduction pipe 92 from the etching gas supply unit 90 (see FIG. 2) may flow along the surfaces of the optical elements in the mirror unit 101C to the outside of the space 115. The surfaces of the optical elements may include the surface of the dichroic mirror 132, the surface of the focusing lens 128, and so forth. Debris deposited on the surfaces of the optical elements may be etched by the etching gas.

Referring to FIG. 13, the baffles 114, 129, and 127 may respectively reduce the debris to be deposited on the surfaces of the window 113, the focusing lens 128, and the window 123. The etching gas supply unit 90 (see FIG. 2) may cause the etching gas to flow along the surfaces of the optical elements through a pipe (not separately shown). Thus, debris deposited on the surfaces of the optical elements may be etched.

5.3.3 Effect

According to the third example, the beam dumps 112 and 142, which are subjected to a large heat load as they absorb the pulse laser beam 33, may be provided inside the sub-chamber 102. Thus, the beam dumps 112 and 142, which may emit radiation heat, may be kept away from the mirror unit 101C. As a result, thermal deformation in the mirror unit 101C may be suppressed, and the beam path of the guide beam 41 may be stabilized.

6. Modification of Guide Beam Optical System 6.1 Configuration

Figure 14:
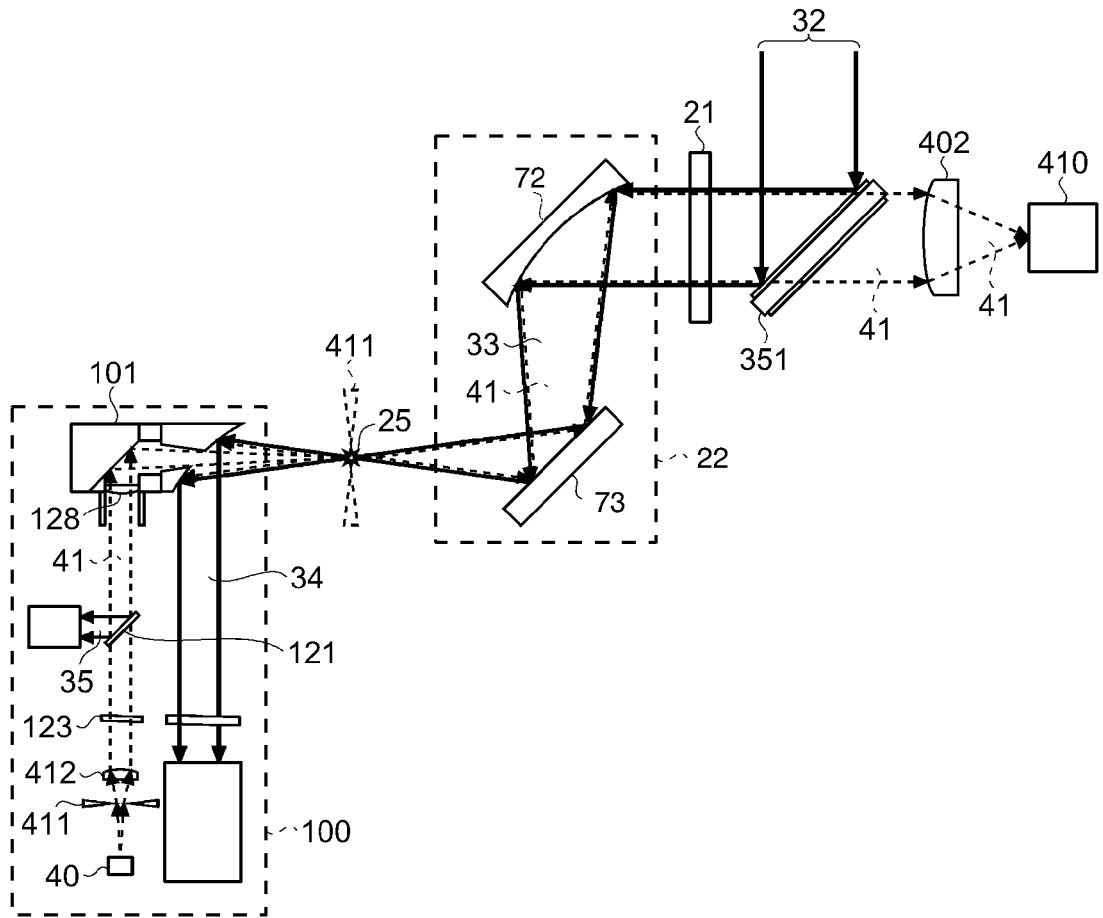
FIG. 14 schematically illustrates an example of the configuration of an optical system for a guide beam in a modification of the EUV light generation system.

FIG. 14 schematically illustrates an example of the configuration of an optical system relating to the guide beam 41 in a modification of the EUV light generation system 11A (see FIG. 2). In FIG. 14, only an example of the primary optical systems is illustrated, and omitted elements may be similar to those of the above-described configuration.

As shown in FIG. 14, in the modification, a pinhole plate 411 and a collimator 412 in a mirror unit 100 may be provided in place of the collimator 401 in FIG. 2. The pinhole plate 411 may be provided at the focus of the collimator 412. The pinhole plate 411 may be configured such that the pinhole formed therein is smaller in diameter than the guide beam 41 from the guide beam output device 40. Alternatively, the diameter of the pinhole may be set approximately to the spot size of the pulse laser beam 33 in the plasma generation region 25.

6.2 Operation

With reference to FIG. 14, the guide beam 41 outputted from the guide beam output device 40 may be incident on the pinhole plate 411. The guide beam 41 that has passed through the pinhole in the pinhole plate 411 may be diverged and be incident on the collimator 412. Thus, the guide beam 41 may be collimated by the collimator 412.

The collimated guide beam 41 may be transmitted through window 123 and the dichroic mirror 121, and enter the mirror unit 101. The mirror unit 101 may reflect the guide beam 41 toward the plasma generation region 25. Thus, the axis of the beam path of the guide beam 41 may substantially coincide with the axis of the beam path of the pulse laser beam 33.

The guide beam 41 reflected by the mirror unit 101 may be focused in the plasma generation region 25. At this time, the image of the guide beam 41 at the pinhole in the pinhole plate 411 may be imaged as a shadow of the guide beam 41 at the focus of the laser beam focusing optical system 22 in the plasma generation region 25. For example, the focal distance of the collimator 412 for the wavelength of the guide beam 41 may be adjusted to match the focal distance of the focusing lens 128. Thus, the image of the guide beam 41 at the pinhole may be transferred with the same magnification in the plasma generation region 25.

Referring to FIG. 14, the guide beam 41 that has passed through the plasma generation region 25 may enter the image sensor 410 provided at the focus of the imaging optical system 402 through the laser beam focusing optical system 22, the beam adjusting unit 350 (see FIG. 2), and the imaging optical system 402. The image of the guide beam 41 at the pinhole may be imaged as the shadow of the guide beam 41 on the photosensitive surface of the image sensor 410. The image data of the guide beam 41 at the pinhole may be sent to the EUV light generation position controller 51 (see FIG. 2).

Figure 15:
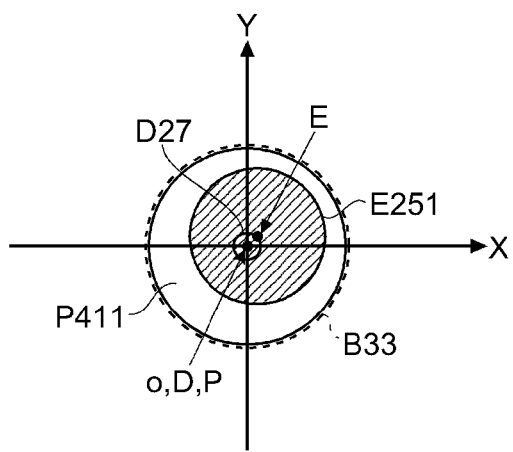
FIG. 15 shows an image of a droplet and an image of a guide beam at a pinhole in a pinhole plate imaged on the image sensor in FIG. 14.

FIG. 15 shows an image P411 of the guide beam 41 at the pinhole in the pinhole plate 411 imaged on the image sensor 410 in FIG. 14 and the image D27 of the droplet 27. In FIG. 15, a cross-sectional image B33 of the pulse laser beam 33 at its focus in the plasma generation region 25 is shown as well.

As shown in FIG. 15, in the modification, the image P411 of the guide beam 41 may be substantially the same in size as the cross-sectional image B33 of the pulse laser beam 33. Referring to FIG. 14, the guide beam 41 may travel along substantially the same path as the pulse laser beam 33 from the mirror unit 101 to the dichroic mirror 351. Accordingly, the image P411 of the guide beam 41 may reflect the focus position and the beam diameter of the pulse laser beam 33. Further, as in the first embodiment, the image sensor 410 may detect the image E251 of the light 251, and calculate the center E of the image E251. Accordingly, the EUV light generation position controller 51 may control the focus of the pulse laser beam 33 and the position to which the droplet 27 is supplied such that the center P of the image P411 coincides with the center E of the image E251. At this time, the focus of the pulse laser beam 33 and the position to which the droplet 27 is supplied may be controlled so that the centers of the respective images coincide with a predetermined target position (e.g., the origin o). Here, in place of the centers of the respective images, the centroids of the respective images may be obtained.

6.3 Effect

According to the modification of FIGS. 14 and 15, the beam path of the guide beam 41 and the beam path of the pulse laser beam 33 may be made to substantially coincide with each other. Further, the image of the guide beam 41 at the pinhole may be transferred in the plasma generation region 25. Accordingly, without actually outputting the pulse laser beam 33, the center and the beam diameter of the pulse laser beam 33 may be detected based on the detection result of the image P411 of the guide beam 41.

Figure 16:
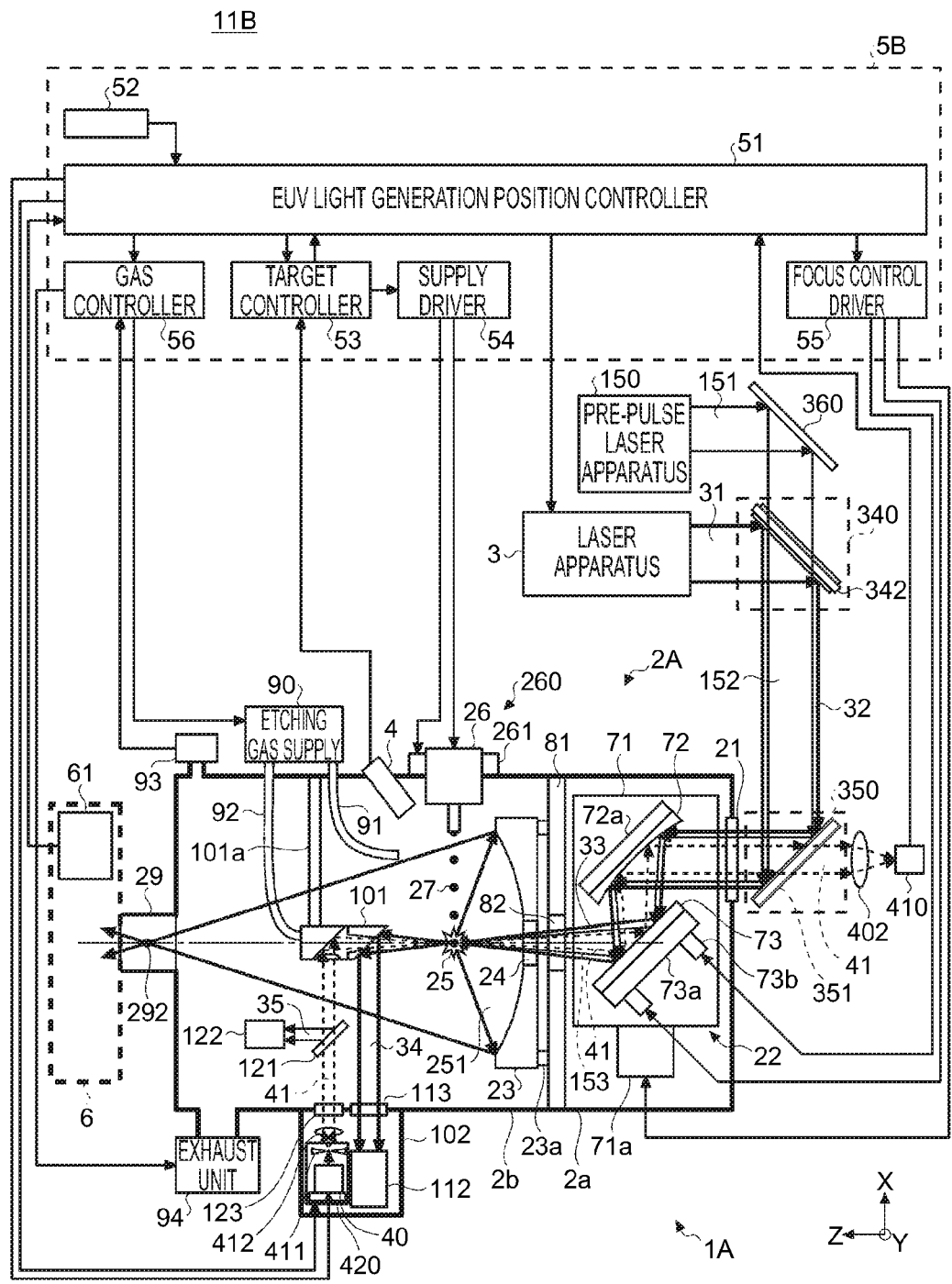
FIG. 16 schematically illustrates an example of the configuration of an EUV light generation system according to a second embodiment of this disclosure.

7. EUV Light Generation System Including Pre-pulse Laser Apparatus and Main Pulse Laser Apparatus: Second Embodiment 7.1 Configuration FIG. 16 schematically illustrates an example of the configuration of an EUV light generation system 11B according to a second embodiment. As shown in FIG. 16, the EUV light generation system 11B may be similar in configuration to the EUV light generation system 11A shown in FIGS. 2 and 14, but may further include a pre-pulse laser apparatus 150 and a high-reflection mirror 360. The high-reflection mirror 341 in the beam delivery unit 340 may be replaced by a dichroic mirror 342. Hereinafter, the laser apparatus 3 may be referred to as a main pulse laser apparatus 3, and the pulse laser beams 31 through 33 may be referred to as main pulse laser beam 31 through 33.

The pre-pulse laser apparatus 150 may, for example, be a YAG laser. A pre-pulse laser beam 151 outputted from the pre-pulse laser apparatus 150 may be reflected by the high-reflection mirror 360. The reflected pre-pulse laser beam 151 may be incident on the dichroic mirror 342 of the beam delivery unit 340. The dichroic mirror 342 may be coated with a film configured to transmit the pre-pulse laser beam 151 with high transmittance and reflect the main pulse laser beam 31 with high reflectance. The pre-pulse laser beam 151 incident on the dichroic mirror 342 may be transmitted therethrough. Thus, the axis of the beam path of the pre-pulse laser beam 151 and the axis of the beam path of the main pulse laser beam 32 may be made to substantially coincide with each other. Alternatively, the configuration may be such that the axis of the beam path of the pre-pulse laser beam 152 and the axis of the beam path of the main pulse laser beam 32 are set to be in a predetermined positional relationship.

In the EUV light generation system 11B, the guide beam output device 40 inside the sub-chamber 102 may be provided with a three-axis moving mechanism 420. The three-axis moving mechanism 420 may be configured to move the guide beam output device 40 under the control of the EUV light generation position controller 51. At this time, the three-axis moving mechanism 420 may move the pinhole plate 411 along with the guide beam output device 40.

7.2 Operation

The operation of the EUV light generation system 11B shown in FIG. 16 will now be described. Hereinafter, the operation of the EUV light generation system 11B will be described using the image P411 (see FIG. 15) of the guide beam 41 at the pinhole in the pinhole plate 411 imaged on the photosensitive surface of the image sensor 410, the image D27 (see FIG. 15) of the droplet 27 or an image F27 of the diffused target, the estimated cross-sectional image B33 (see FIG. 15) of the main pulse laser beam 33 at its focus, and the image E251 (see FIG. 15) of the light 251 containing the EUV light.

In the description to follow, the focus of a pre-pulse laser beam 153 and the focus of the main pulse laser beam 33 may substantially coincide with each other, or may be set to be in a predetermined positional relationship. Further, the pinhole in the pinhole plate 411 may be configured so that the diameter of the image P411 (see FIG. 15) of the guide beam 41 is substantially the same in size as the spot size of the main pulse laser beam 33.

Figure 17:
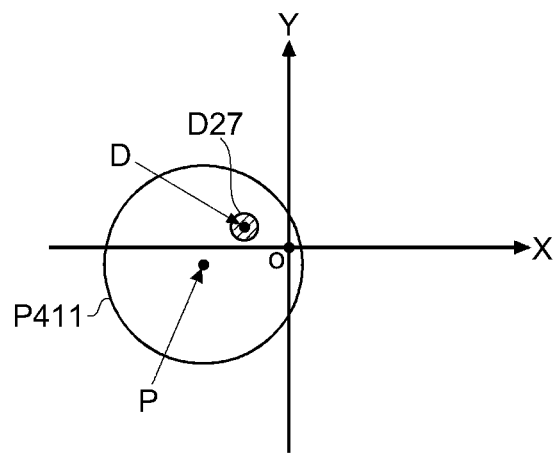
FIG. 17 shows an example of an image to be detected by an image sensor in a case where the center of a guide beam and the center of a droplet do not coincide with an origin when the droplet is irradiated with a pulse laser beam in the second embodiment.

FIG. 17 shows an example of an image to be detected by the image sensor 410 in a state where the pre-pulse laser beam 151 and the main pulse laser beam 31 are not outputted. FIG. 17 shows an example where the position of the center P of the image P411 and the position of the center D of the image D27 do not coincide with the origin o. In the example shown in FIG. 17, the center P of the image P411 doe not coincide with the origin o. Similarly, the center D of the image D27 does not coincide with the origin o. The position of the center P and the position of the center D may, for example, be obtained through various methods, such as by calculating the centers from the beam intensity distribution in the images acquired by the image sensor 410. Alternatively, the centroids may be used in place of the centers.

Figure 18:
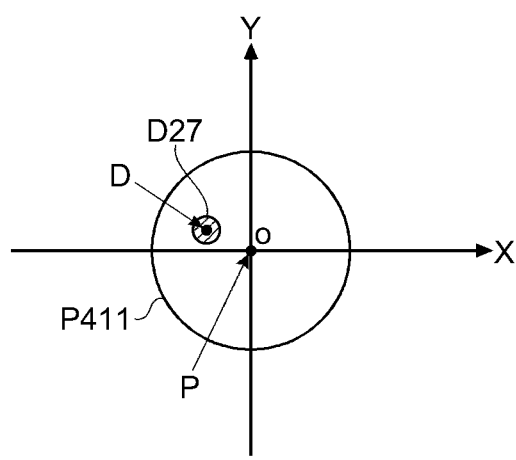
FIG. 18 shows an example of an image to be detected by an image sensor after a laser beam focusing optical system is adjusted in the second embodiment.

FIG. 18 shows an example of an image to be detected by the image sensor 410 after the laser beam focusing optical system 22 is adjusted from the state shown in FIG. 17. As shown in FIG. 18, after the laser beam focusing optical system 22 is adjusted, the center P of the image P411 may substantially coincide with the origin o.

Figure 19:
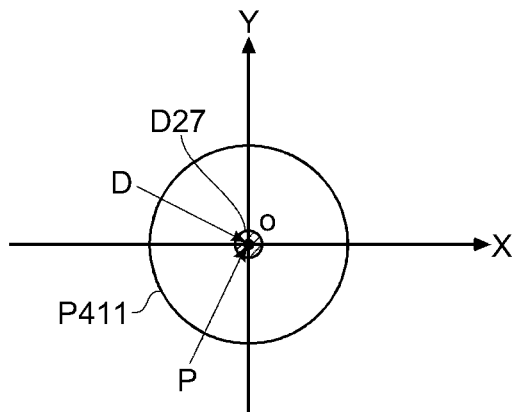
FIG. 19 shows an example of an image to be detected by an image sensor after a target supply unit is adjusted in the second embodiment.

FIG. 19 shows an example of an image to be detected by the image sensor 410 after the target supply unit 260 is adjusted from the state shown in FIG. 18. As shown in FIG. 19, after the target supply unit 260 is adjusted, the center D of the image D27 may substantially coincide with the origin o.

Figure 20:
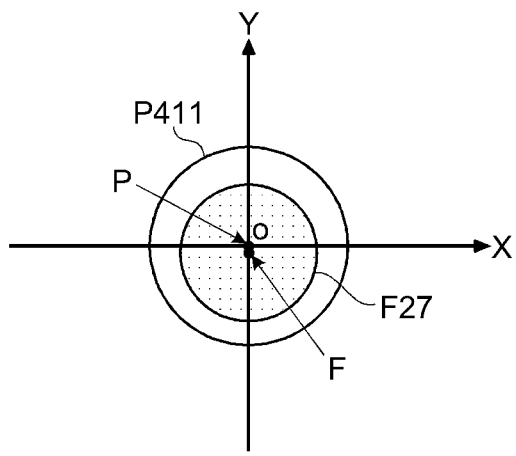
FIG. 20 shows an example of an image to be detected by an image sensor when the droplet is irradiated with a pre-pulse laser beam in the state shown in FIG. 19.

FIG. 20 shows an example of an image to be detected by the image sensor 410 when the droplet 27 is irradiated with the pre-pulse laser beam 153 in the state shown in FIG. 19. As shown in FIG. 19, after the laser beam focusing optical system 22 and the target supply unit 260 are adjusted, both the center P of the image P411 and the center D of the image D27 may substantially coincide with the origin o. Since the focus of the pre-pulse laser beam 153 substantially coincides with the focus of the main pulse laser beam 33, the image F27 of the diffused target to be generated when the droplet 27 is irradiated with the pre-pulse laser beam 153 under the state shown in FIG. 19 may be in the visual field of the image sensor 410. Further, the center F of the image F27 may be at or around the origin o.

Figure 21:
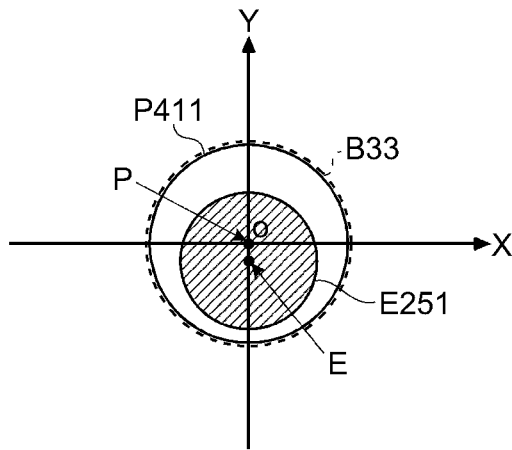
FIG. 21 shows an example of an image to be detected by an image sensor when a diffused target is irradiated with a main pulse laser beam after a predetermined time has elapsed since the state shown in FIG. 20.

FIG. 21 shows an example of an image to be detected by the image sensor 410 when the diffused target is irradiated with the main pulse laser beam 33 after a predetermined time has elapsed since the state shown in FIG. 20. As shown in FIG. 21, the center E of the image E251 may be at or around the origin o. That is, although the diffused target generated around the origin o may move slightly while the predetermined time elapses, the diffused target may still be irradiated with the main pulse laser beam 33 within the visual field of the image sensor 410. As a result, the light 251 may be generated around the origin o.

7.3 Effect

According to the second embodiment, the guide beam 41 may be focused in the position at which the droplet 27 is to be irradiated with the pre-pulse laser beam 153. Further, the image of the guide beam 41 at this position may be detected through the laser beam focusing optical system 22 and the imaging optical system 402. As a result, the position at which the pre-pulse laser beam 153 is focused, the position of the droplet 27, and the position at which the light 251 is generated may be detected simultaneously. Then, the focus of the laser beam focusing optical system 22 and the position of the droplet 27 may be controlled based on the detection result, whereby the focus of the laser beam focusing optical system 22 and the position of the droplet 27 may be controlled with high precision to the desired target position. Thus, the droplet 27 may be irradiated with the pre-pulse laser beam 153 stably. As a result, the diffused target may be generated at or around the desired target position with high precision.

Further, the position at which the diffused target is generated may be detected using the guide beam 41. Accordingly, the positional relationship between the diffused target and the main pulse laser beam 33 may be estimated before the diffused target is irradiated with the main pulse laser beam 33. Then, the diffused target may be irradiated with the main pulse laser beam 33 within the visual field of the image sensor 410.

7.4 Flowchart

Figure 22:
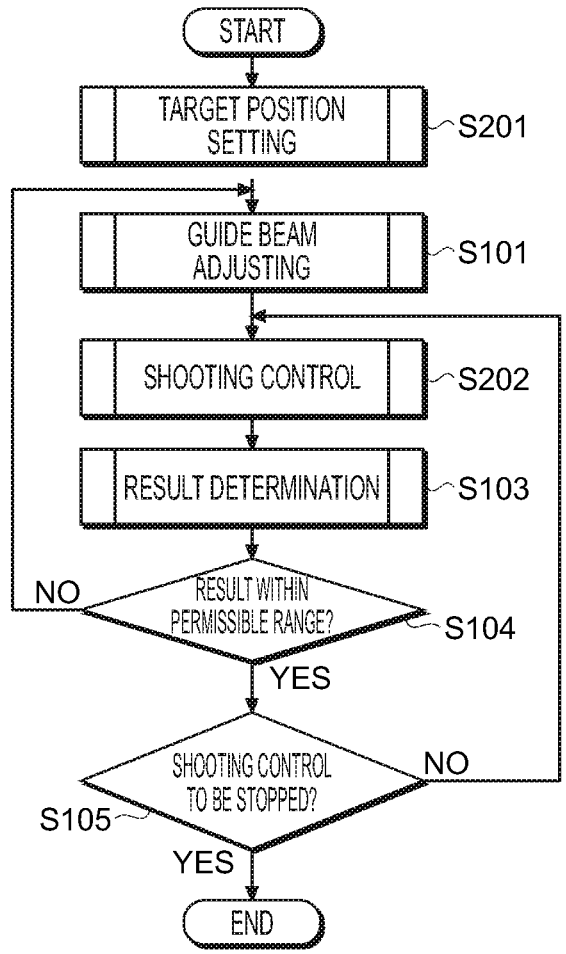
FIG. 22 is a flowchart showing an overall operation of an EUV light generation controller according to the second embodiment.
Figure 23:
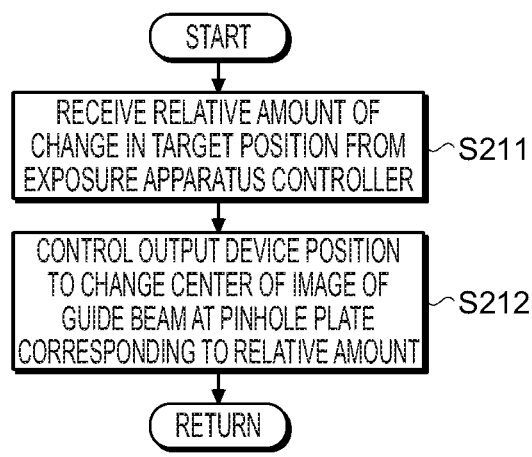
FIG. 23 is a flowchart showing an example of a target position setting subroutine of FIG. 22.
Figure 24:
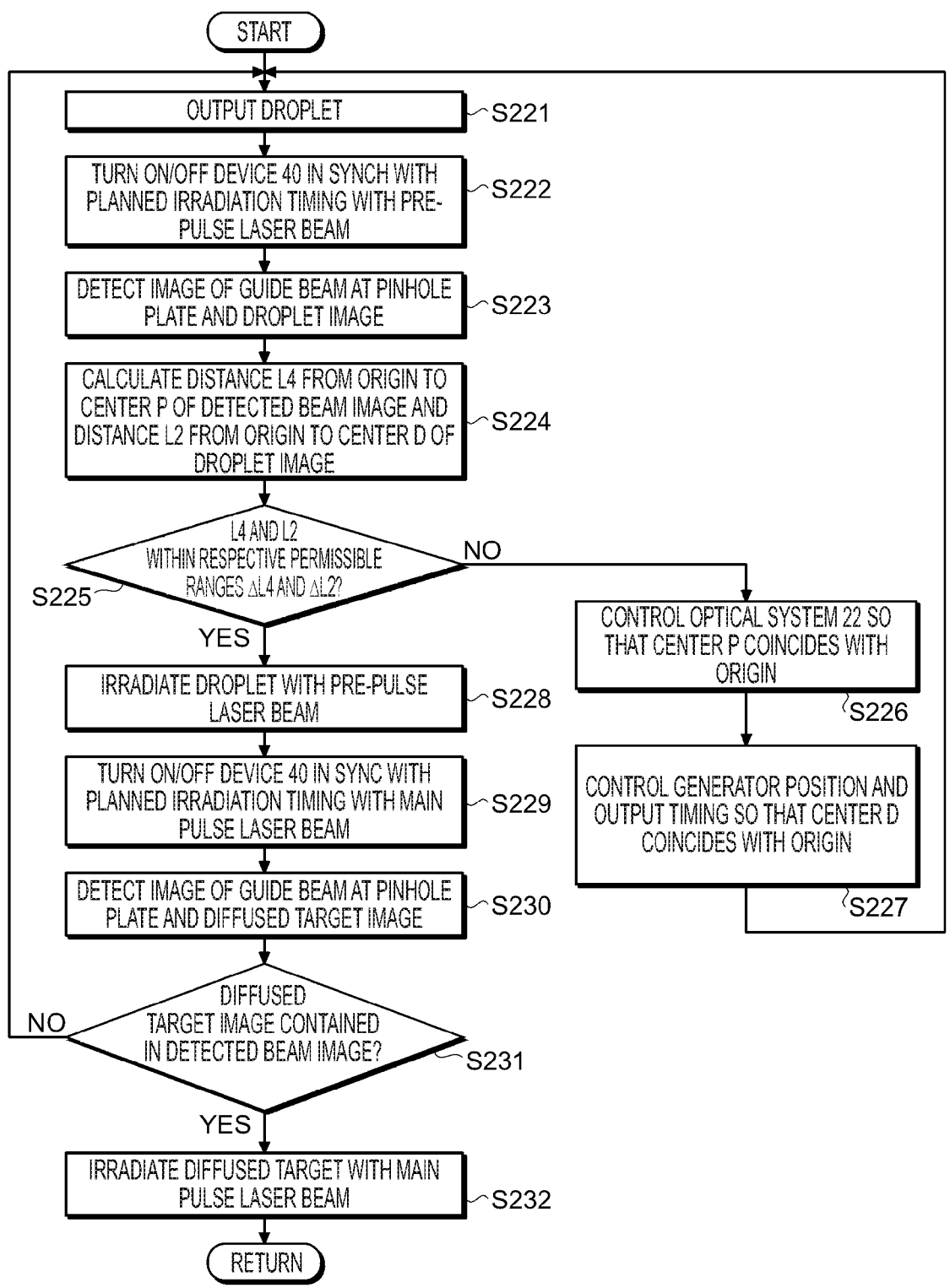
FIG. 24 is a flowchart showing an example of a shooting control subroutine of FIG. 22.

The operation of an EUV light generation controller 5B of the second embodiment will now be described in detail with reference to the drawings. FIG. 22 is a flowchart showing an overall operation of the EUV light generation controller 5B of the second embodiment. FIG. 23 is a flowchart showing an example of a target position setting subroutine of FIG. 22. FIG. 24 is a flowchart showing an example of a shooting control subroutine of FIG. 22.

The operation shown in FIG. 22 may be carried out when the EUV light generation controller 5B receives an instruction for a burst operation from an external apparatus, such as the exposure apparatus controller 61, or when the EUV light generation controller 5B is started.

As shown in FIG. 22, the EUV light generation controller 5B may receive an instruction regarding the generation position of the light 251 from the exposure apparatus controller 61, and carry out the target position setting subroutine for setting the received generation position to the target plasma generation position (Step S201). Then, the EUV light generation controller 5B may carry out the guide beam adjusting subroutine (Step S101). The guide beam adjusting subroutine may be similar to that shown in FIG. 8.

Then, the EUV light generation controller 5B may carry out the shooting control subroutine to generate the light 251 (Step S202). Subsequently, the EUV light generation controller 5B may carry out the result determination subroutine to determine whether or not the generation result of the light 251 through the shooting control subroutine in Step S202 falls within a permissible range (Step S103). The result determination subroutine may be similar to that shown in FIG. 10.

When the generation result of the light 251 is determined not to fall within the permissible range based on the result of Step S103 (Step S104; NO), the EUV light generation controller 5B may return to Step S101 and repeat the subsequent steps. When the generation result of the light 251 is determined to fall within the permissible range based on the result of Step S103 (Step S104; YES), the EUV light generation controller 5B may determine whether or not to stop the shooting control (Step S105). When shooting control is to be stopped (Step S105; YES), the EUV light generation controller 5B may terminate the operation shown in FIG. 22. On the other hand, when the shooting control is not to be stopped (Step S105; NO), the EUV light generation controller 5B may return to Step S202 and repeat the subsequent steps.

With reference to FIG. 23, in the target position setting subroutine shown in Step S201 of FIG. 22, the EUV light generation controller 5B may first receive a relative amount of change in the target position at which the light 251 is to be generated from the current position (or the initial position) from the exposure apparatus controller 61 (Step S211).

Then, the EUV light generation controller 5B may actuate the three-axis moving mechanism 420 to control the position of the guide beam output device 40 so that the center P of the image P411 of the guide beam 41 changes by the amount corresponding to the aforementioned relative amount of change. At this time, the position of the pinhole plate 411 may be controlled along with the position of the guide beam output device 40 (Step S212). Thereafter, the EUV light generation controller 5B may return to the operation shown in FIG. 22.

With reference to FIG. 24, in the shooting control subroutine in Step S202 of FIG. 22, the EUV light generation controller 5B may first cause the droplets 27 to be outputted (Step S221). Subsequently, the EUV light generation controller 5B may turn on and off the guide beam output device 40 in synchronization with the planned irradiation timing with the pre-pulse laser beam 153 (Step S222). Then, the EUV light generation controller 5B may operate the image sensor 410 to detect the image P411 of the guide beam 41 and the image D27 of the droplet 27 (Step S223). Then, the EUV light generation controller 5B may analyze the image P411 and the image D27. Thus, the EUV light generation controller 5B may calculate a distance L4 between the center P of the image P411 and the origin o and the distance L2 between the center D of the image D27 and the origin o (Step S224).

Subsequently, the EUV light generation controller 5B may determine whether or not the calculated distances L4 and L2 fall within the permissible ranges ΔL4 and ΔL2, respectively (Step S225). The permissible ranges ΔL4 and ΔL2 may be set in advance or inputted from an external apparatus, such as the exposure apparatus controller 61. When the distances L4 and L2 do not fall within the respective permissible ranges ΔL4 and ΔL2 (Step S225; NO), the EUV light generation controller 5B may actuate the laser beam focusing optical system 22 so that the center P of the image P411 coincides with the origin o (Step S226). Further, the EUV light generation controller 5B may actuate the two-axis moving mechanism 261 of the target supply unit 260 so that the center D of the image D27 coincides with the origin o. Here, the EUV light generation controller 5B may also correct the timing at which the droplet 27 is outputted from the droplet generator 26 (Step S227). Thereafter, the EUV light generation controller 5B may return to Step S221. Note that only one of the Steps S226 and S227 may be carried out as necessary.

On the other hand, when the distances L4 and L2 fall within the respective permissible ranges ΔL4 and ΔL2 (Step S225; YES), the EUV light generation controller 5B may actuate the pre-pulse laser apparatus 150 so that the droplet 27 is irradiated with the pre-pulse laser beam 153 (Step S228). Thus, the droplet 27 may be turned into the diffused target at the desired target position.

Subsequently, the EUV light generation controller 5B may turn on and off the guide beam output device 40 in synchronization with the planned irradiation timing with the main pulse laser beam 33 (Step S229). Then, the EUV light generation controller 5B may operate the image sensor 410 to detect the image P411 of the guide beam 41 and the image F27 of the diffused target (Step S230). Thereafter, the EUV light generation controller 5B may analyze the image P411 and the image F27. Thus, the EUV light generation controller 5B may determine whether or not the image F27 is contained in the image P411 (Step S231). The state where the image F27 is contained in the image P411 means that the image F27 is detected within the image P411, as shown in FIG. 20.

Based on the determination result in Step S231, when the image F27 is not contained in the image P411 (Step S231; NO), the EUV light generation controller 5B may return to Step S221 and repeat the subsequent steps. On the other hand, when the image F27 is contained in the image P411 (Step S231; YES), the EUV light generation controller 5B may actuate the main pulse laser apparatus 3 and cause the diffused target to be irradiated with the main pulse laser beam 33 (Step S232). Thus, the light 251 may be generated. Thereafter, the EUV light generation controller 5B may return to the operation shown in FIG. 22.

With the above-described operation, the position at which the light 251 is generated may be kept within the permissible range.

The above-described embodiments and the modifications thereof are merely examples for implementing this disclosure, and this disclosure is not limited thereto. Making various modifications according to the specifications or the like is within the scope of this disclosure, and other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as at least one or "one or more."

What is claimed is:

1. A chamber apparatus for operating with a laser apparatus, the chamber apparatus comprising:
    a chamber having a first inlet for introducing a laser beam thereinto;
    a target supply unit configured to supply a target material to a region inside the chamber;
    a first optical system for focusing the laser beam in the region;
    a guide beam output device configured to output a guide beam; and
    a second optical system configured to direct the guide beam such that an axis of a beam path of the guide beam substantially coincides with an axis of a beam path of the laser beam and such that the guide beam enters the first optical system through the region.

2. The chamber apparatus according to claim 1, further comprising a detection unit configured to detect an image of the guide beam that has passed through the first optical system.

3. The chamber apparatus according to claim 2, further comprising:
    a first driving mechanism configured to move the first optical system; and
    a controller configured to control the first driving mechanism such that the image of the guide beam detected by the detection unit lies in a desired position.

4. The chamber apparatus according to claim 3, further comprising a second driving mechanism configured to move the target supply unit,
    wherein the controller is further configured to control the second driving mechanism such that an image of the target material contained in the image of the guide beam lies in the desired position.

5. The chamber apparatus according to claim 3,
    wherein the second optical system includes:
        a member having a pinhole for allowing the guide beam to pass therethrough;
        a first imaging optical system configured to transfer an image of the guide beam at the pinhole to the region; and
        a second imaging optical system for transferring the image of the guide beam at the pinhole onto the detection unit,
    wherein the controller is configured to control the first driving mechanism such that the image of the guide beam at the pinhole detected by the detection unit lies in another desired position.

6. The chamber apparatus according to claim 5, further comprising a second driving mechanism configured to move the target supply unit,
    wherein the controller is configured to control the second driving mechanism such that an image of the target material contained in the image of the guide beam at the pinhole detected by the detection unit lies in a particular desired position.

7. The chamber apparatus according to claim 1, wherein the guide beam output device is located outside the chamber, and
    the chamber includes a second inlet for introducing the beam into the chamber.

8. The chamber apparatus according to claim 1, wherein the second optical system is located inside the chamber.

9. An apparatus for generating extreme ultraviolet light, comprising:
    the chamber apparatus of claim 1; and
    a laser apparatus configured to output a laser beam.

10. A method for controlling an apparatus configured to generate extreme ultraviolet light, the apparatus including a laser apparatus, a chamber, a target supply unit, a focusing opcal system, a guide beam output device, an optical system, a detection unit, a first driving mechanism, and a controller, the method comprising:
    controlling the first driving mechanism such that an image of a guide beam detected by the detection unit lies in a desired position.

11. The method according to claim 10, further comprising controlling a second driving mechanism configured to move the target supply unit such that an image of a target material contained in the image of the guide beam lies in the desired position.

12. The method according to claim 11, further comprising controlling a second driving mechanism to move the target supply unit such that an image of a target material contained in the image of the guide beam lies in the desired position.

13. A method for controlling an extreme ultraviolet light source, the method comprising the steps of:
   introducing a laser beam into a chamber;
   supplying a target mate to a region inside the chamber by a target supply unit;
   focusing the laser beam in the region through a first optical system;
   outputting a guide beam;
   directing, by a second optical system, the guide beam such that an axis of a beam path of the guide beam substantially coincides with an axis of a beam path of the laser beam and such that the guide beam enters the first optical system through the region;
   detecting an image of the guide beam that has passed through the first optical system; and
   controlling a first driving mechanism to move the first optical system such that an image of the guide beam detected by the detection unit lies in a desired position.

* * * * *